United States Patent
Rafanan

(10) Patent No.: US 7,569,488 B2
(45) Date of Patent: Aug. 4, 2009

(54) METHODS OF MAKING A MEMS DEVICE BY MONITORING A PROCESS PARAMETER

(75) Inventor: Marjorio Rafanan, Milpitas, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/767,430

(22) Filed: Jun. 22, 2007

(65) Prior Publication Data
US 2008/0318344 A1 Dec. 25, 2008

(51) Int. Cl.
*H01L 21/302* (2006.01)
(52) U.S. Cl. .................. 438/714; 438/711; 438/710; 438/48; 438/50
(58) Field of Classification Search ............. 438/48–52, 438/710–714
See application file for complete search history.

(56) References Cited

U.S. PATENT DOCUMENTS

| | | |
|---|---|---|
| 4,500,171 A | 2/1985 | Penz et al. |
| 4,519,676 A | 5/1985 | te Velde |
| 4,566,935 A | 1/1986 | Hornbeck |
| 4,710,732 A | 12/1987 | Hornbeck |
| 4,852,516 A | 8/1989 | Rubin et al. |
| 4,900,395 A | 2/1990 | Syverson et al. |
| 4,954,789 A | 9/1990 | Sampsell |
| 4,956,619 A | 9/1990 | Hornbeck |
| 5,002,631 A | 3/1991 | Giapis et al. |
| 5,083,364 A | 1/1992 | Olbrich et al. |
| 5,083,857 A | 1/1992 | Hornbeck |
| 5,099,353 A | 3/1992 | Hornbeck |
| 5,124,834 A | 6/1992 | Cusano et al. |
| 5,216,537 A | 6/1993 | Hornbeck |
| 5,231,532 A | 7/1993 | Magel et al. |
| 5,293,272 A | 3/1994 | Jannson et al. |
| 5,324,683 A | 6/1994 | Fitch et al. |
| 5,334,250 A | 8/1994 | Mikami et al. |
| 5,345,328 A | 9/1994 | Fritz et al. |
| 5,374,346 A | 12/1994 | Bladon et al. |
| 5,454,906 A | 10/1995 | Baker et al. |
| 5,536,359 A | 7/1996 | Kawada et al. |
| 5,583,688 A | 12/1996 | Hornbeck |

(Continued)

FOREIGN PATENT DOCUMENTS

DE  199 38 072  3/2000

(Continued)

OTHER PUBLICATIONS

Raley et al., "A Fabry-Perot Microinterferometer for Visible Wavelengths," IEEE Solid-State Sensor and Actuator Workshop, Hilton-Head, SC, pp. 170-173 (1992).

(Continued)

*Primary Examiner*—Dung A. Le
(74) *Attorney, Agent, or Firm*—Knobbe Martens Olson & Bear LLP

(57) ABSTRACT

Embodiments of the present invention relate to methods and systems for making a microelectromechanical system MEMS device comprising supplying an etchant to etch one or more sacrificial structures of the system in a chamber. A process parameter relating to the pressure within the chamber is monitored as a function of time to provide an indication of the extent of the etching of the one or more sacrificial structures.

71 Claims, 12 Drawing Sheets

U.S. PATENT DOCUMENTS

| | | | |
|---|---|---|---|
| 5,646,768 A | 7/1997 | Kaeiyama | |
| 5,726,480 A | 3/1998 | Pister | |
| 5,773,088 A | 6/1998 | Bhat | |
| 5,784,212 A | 7/1998 | Hornbeck | |
| 5,785,877 A | 7/1998 | Sato et al. | |
| 5,822,110 A | 10/1998 | Dabbaj | |
| 5,825,528 A | 10/1998 | Goossen | |
| 5,835,255 A | 11/1998 | Miles | |
| 5,896,796 A | 4/1999 | Chih | |
| 5,906,536 A | 5/1999 | Imazato et al. | |
| 5,919,548 A | 7/1999 | Barron et al. | |
| 5,940,684 A | 8/1999 | Shakuda et al. | |
| 5,967,163 A | 10/1999 | Pan et al. | |
| 5,986,796 A | 11/1999 | Miles | |
| 6,031,653 A | 2/2000 | Wang | |
| 6,033,919 A | 3/2000 | Gnade et al. | |
| 6,040,937 A | 3/2000 | Miles | |
| 6,165,890 A | 12/2000 | Kohl et al. | |
| 6,170,332 B1 | 1/2001 | MacDonald et al. | |
| 6,204,080 B1 | 3/2001 | Hwang | |
| 6,215,221 B1 | 4/2001 | Cabuz et al. | |
| 6,218,056 B1 | 4/2001 | Pinarbasi et al. | |
| 6,288,472 B1 | 9/2001 | Cabuz et al. | |
| 6,297,072 B1 | 10/2001 | Tilmans et al. | |
| 6,335,224 B1 | 1/2002 | Peterson et al. | |
| 6,359,673 B1 | 3/2002 | Stephenson | |
| 6,377,233 B2 | 4/2002 | Colgan et al. | |
| 6,407,851 B1 | 6/2002 | Islam et al. | |
| 6,409,876 B1 | 6/2002 | McQuarrie et al. | |
| 6,447,126 B1 | 9/2002 | Hornbeck | |
| 6,448,622 B1 | 9/2002 | Franke et al. | |
| 6,558,506 B1 | 5/2003 | Freeman et al. | |
| 6,574,033 B1 | 6/2003 | Chui et al. | |
| 6,602,791 B2 | 8/2003 | Ouellet et al. | |
| 6,618,187 B2 | 9/2003 | Pilossof | |
| 6,635,919 B1 | 10/2003 | Melendez et al. | |
| 6,674,090 B1 | 1/2004 | Chua et al. | |
| 6,674,562 B1 | 1/2004 | Miles | |
| 6,696,096 B2 | 2/2004 | Tsubaki et al. | |
| 6,713,235 B1 | 3/2004 | Ide et al. | |
| 6,720,267 B1 | 4/2004 | Chen et al. | |
| 6,736,987 B1 | 5/2004 | Cho | |
| 6,747,800 B1 | 6/2004 | Lin | |
| 6,756,317 B2 | 6/2004 | Sniegowski et al. | |
| 6,778,306 B2 | 8/2004 | Sniegowski et al. | |
| 6,782,166 B1 | 8/2004 | Grote et al. | |
| 6,794,119 B2 | 9/2004 | Miles | |
| 6,806,110 B2 | 10/2004 | Lester et al. | |
| 6,812,482 B2 | 11/2004 | Fleming et al. | |
| 6,822,304 B1 | 11/2004 | Honer | |
| 6,861,277 B1 | 3/2005 | Monroe et al. | |
| 6,867,896 B2 | 3/2005 | Miles | |
| 6,870,654 B2 | 3/2005 | Lin et al. | |
| 6,953,702 B2 | 10/2005 | Miller et al. | |
| 6,972,891 B2 | 12/2005 | Patel et al. | |
| 6,982,820 B2 | 1/2006 | Tsai | |
| 6,995,890 B2 | 2/2006 | Lin | |
| 6,999,225 B2 | 2/2006 | Lin | |
| 6,999,236 B2 | 2/2006 | Lin | |
| 7,008,812 B1 | 3/2006 | Carley | |
| 7,012,726 B1 | 3/2006 | Miles | |
| 7,027,202 B1 | 4/2006 | Hunter et al. | |
| 7,041,224 B2 | 5/2006 | Patel et al. | |
| 7,041,571 B2 | 5/2006 | Strane | |
| 7,049,164 B2 | 5/2006 | Bruner | |
| 7,050,219 B2 | 5/2006 | Kimura | |
| 7,064,089 B2 | 6/2006 | Yamazaki et al. | |
| 7,078,293 B2 | 7/2006 | Lin et al. | |
| 7,110,158 B2 | 9/2006 | Miles | |
| 7,119,945 B2 | 10/2006 | Cummings et al. | |
| 7,123,216 B1 | 10/2006 | Miles | |
| 7,172,915 B2 | 2/2007 | Lin et al. | |
| 7,195,343 B2 | 3/2007 | Anderson et al. | |
| 7,198,973 B2 | 4/2007 | Lin et al. | |
| 7,221,495 B2 | 5/2007 | Miles et al. | |
| 7,256,107 B2 | 8/2007 | Takeuchi et al. | |
| 7,321,457 B2 | 1/2008 | Heald | |
| 7,399,710 B2 * | 7/2008 | Launay | 438/710 |
| 2001/0003487 A1 | 6/2001 | Miles | |
| 2002/0003400 A1 | 1/2002 | Lee | |
| 2002/0014579 A1 | 2/2002 | Dunfield | |
| 2002/0021485 A1 | 2/2002 | Pilossof | |
| 2002/0027636 A1 | 3/2002 | Yamada | |
| 2002/0033229 A1 | 3/2002 | Lebouitz et al. | |
| 2002/0045362 A1 | 4/2002 | Yang et al. | |
| 2002/0055253 A1 | 5/2002 | Rudhard | |
| 2002/0086455 A1 | 7/2002 | Franosch et al. | |
| 2002/0110948 A1 | 8/2002 | Huang et al. | |
| 2002/0117728 A1 | 8/2002 | Brosnihhan et al. | |
| 2002/0195423 A1 | 12/2002 | Patel et al. | |
| 2003/0006468 A1 | 1/2003 | Ma et al. | |
| 2003/0072070 A1 | 4/2003 | Miles | |
| 2003/0073302 A1 | 4/2003 | Huibers | |
| 2003/0104752 A1 | 6/2003 | Lee et al. | |
| 2003/0121609 A1 | 7/2003 | Ohmi et al. | |
| 2003/0202264 A1 | 10/2003 | Weber et al. | |
| 2003/0202265 A1 | 10/2003 | Reboa et al. | |
| 2004/0028849 A1 | 2/2004 | Stark et al. | |
| 2004/0035821 A1 | 2/2004 | Doan et al. | |
| 2004/0038513 A1 | 2/2004 | Kohl et al. | |
| 2004/0053434 A1 | 3/2004 | Bruner | |
| 2004/0080832 A1 | 4/2004 | Singh | |
| 2004/0124483 A1 | 7/2004 | Partridge et al. | |
| 2004/0124495 A1 | 7/2004 | Chen et al. | |
| 2004/0136076 A1 | 7/2004 | Tayebati | |
| 2004/0188785 A1 | 9/2004 | Cunningham et al. | |
| 2004/0191937 A1 | 9/2004 | Patel et al. | |
| 2004/0191946 A1 | 9/2004 | Patel et al. | |
| 2004/0197526 A1 | 10/2004 | Mehta | |
| 2004/0207898 A1 | 10/2004 | Lin et al. | |
| 2004/0209195 A1 | 10/2004 | Lin | |
| 2004/0217264 A1 | 11/2004 | Wood et al. | |
| 2005/0001274 A1 | 1/2005 | Kim et al. | |
| 2005/0014374 A1 | 1/2005 | Partridge et al. | |
| 2005/0020089 A1 | 1/2005 | Shi et al. | |
| 2005/0045276 A1 | 3/2005 | Patel et al. | |
| 2005/0078348 A1 | 4/2005 | Lin | |
| 2005/0098840 A1 | 5/2005 | Fuertsch et al. | |
| 2005/0118832 A1 | 6/2005 | Korzenski et al. | |
| 2005/0170670 A1 | 8/2005 | King et al. | |
| 2005/0195462 A1 | 9/2005 | Lin | |
| 2005/0195467 A1 | 9/2005 | Kothari et al. | |
| 2006/0066932 A1 | 3/2006 | Chui | |
| 2006/0066935 A1 | 3/2006 | Cummings et al. | |
| 2006/0067650 A1 | 3/2006 | Chui | |
| 2006/0076311 A1 | 4/2006 | Tung et al. | |
| 2006/0077502 A1 | 4/2006 | Tung et al. | |
| 2006/0077529 A1 | 4/2006 | Chui et al. | |
| 2006/0096705 A1 | 5/2006 | Shi et al. | |
| 2006/0119922 A1 | 6/2006 | Faase et al. | |
| 2006/0177950 A1 | 8/2006 | Lin | |
| 2006/0186759 A1 | 8/2006 | Kim et al. | |
| 2006/0256420 A1 | 11/2006 | Miles et al. | |
| 2006/0257070 A1 | 11/2006 | Lin et al. | |
| 2006/0266730 A1 | 11/2006 | Doan et al. | |
| 2007/0020794 A1 | 1/2007 | DeBar | |
| 2007/0026636 A1 | 2/2007 | Gogoi | |
| 2007/0042521 A1 | 2/2007 | Yama | |
| 2007/0111533 A1 * | 5/2007 | Korzenski et al. | 438/745 |
| 2007/0155051 A1 | 7/2007 | Wang et al. | |
| 2007/0170540 A1 * | 7/2007 | Chung et al. | 257/499 |
| 2007/0196944 A1 | 8/2007 | Chou et al. | |
| 2007/0206267 A1 | 9/2007 | Tung et al. | |
| 2007/0249078 A1 | 10/2007 | Tung et al. | |

| | | | |
|---|---|---|---|
| 2007/0249079 | A1 | 10/2007 | Sasagawa et al. |
| 2007/0249081 | A1 | 10/2007 | Luo et al. |
| 2007/0269748 | A1 | 11/2007 | Miles |
| 2008/0026328 | A1 | 1/2008 | Miles |
| 2008/0029481 | A1 | 2/2008 | Kothari et al. |
| 2008/0068699 | A1 | 3/2008 | Miles |
| 2008/0094687 | A1 | 4/2008 | Heald |
| 2008/0130089 | A1 | 6/2008 | Miles |
| 2008/0226929 | A1 | 9/2008 | Chung et al. |
| 2008/0231931 | A1 | 9/2008 | Londergan et al. |
| 2008/0279498 | A1 | 11/2008 | Sampsell et al. |

FOREIGN PATENT DOCUMENTS

| | | |
|---|---|---|
| EP | 0 035 299 | 9/1983 |
| EP | 0 578 228 | 1/1994 |
| EP | 0 747 684 | 12/1996 |
| EP | 0 788 005 | 8/1997 |
| EP | 0 878 824 | 11/1998 |
| EP | 1 209 738 | 5/2002 |
| EP | 1 452 481 | 9/2004 |
| JP | 49-004993 | 1/1974 |
| JP | 05275401 | 10/1993 |
| JP | 10148644 | 6/1998 |
| JP | 2001-085519 | 3/2001 |
| JP | 2002-0287047 | 3/2001 |
| JP | 2002-207182 | 7/2002 |
| JP | 2002-243937 | 8/2002 |
| JP | 2002-328313 | 11/2002 |
| JP | 2003-001598 | 1/2003 |
| JP | 2004-106074 | 4/2004 |
| JP | 2004-133281 | 4/2004 |
| WO | WO 91/05284 | 4/1991 |
| WO | WO 92/10925 | 6/1992 |
| WO | WO 01/14248 | 3/2001 |
| WO | WO 01/63657 | 8/2001 |
| WO | WO 02/24570 | 3/2002 |
| WO | WO 2004/055885 | 7/2004 |
| WO | WO 2004/075231 | 9/2004 |
| WO | WO 2004079056 | 9/2004 |
| WO | WO 2005/061378 | 7/2005 |
| WO | WO 2006/077390 A | 7/2006 |

OTHER PUBLICATIONS

Brosnihan et al., "Optical IMEMS—A fabrication process for MEMS optical switches with integrated on-chip electronic," Transducers, Solid-State Sensors, Actuators and Microsystems, 12th International Conference 2003, vol. 2, Issue, 8-12, pp. 1638-1642, Jun. 2003.

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.

Ibbotson et al., "Comparison of $XeF_2$ and F-atom reactions with Si and $SiO_2$," Applied Physics Letters, vol. 44, No. 12, pp. 1129-1131 (Jun. 1984).

Penta Vacuum MEMS Etcher Specifications, HTTP—WWW.PENTAVACUUM.COM-MEMES.HTM.

Sridharan et al. "Post-packaging Release a New Concept for Surface-Micromachined Devices" Technical Digest, IEEE Solid-State Sensor & Actuator Workshop, New York, NY US Nov. 8, 1998, pp. 225-228.

Williams, et al. Etch Rates for Micromachining Processing. Journal of Microelectromechanical Systems, vol. 5, No. 4, pp. 256-259, (Dec. 1996).

Winters, et al. The etching of silicon with $XeF_2$ vapor. Applied Physics Letters, vol. 34, No. 1, pp. 70-73, (Jan. 1979).

Yao et al., $BrF_3$ dry release technology for large freestanding parylene microstructures and electrostatic actuators, Sensors and Actuators A, vol. 97-98, pp. 771-775, Apr. 2002.

O'Mara, "Chapter Two: Display Manufacturing Process," Liquid Crystal Flat Panel Displays, 1993, pp. 57-111, Chapman & Hall, NY.

Rao et al., Single-mask, three-dimensional microfabrication of high-aspect-ratio structures in bulk silicon using reactive ion etching lag and sacrificial oxidation, Applied Physics Letters 85(25):6281-6283 Dec. 20, 2004.

International Search Report and the Written Opinion of the International Searching Authority in the corresponding PCT Application No. PCT/US2008/067401 dated Feb. 27, 2009.

* cited by examiner

METHODS OF MAKING A MEMS DEVICE BY MONITORING A PROCESS PARAMETER

BACKGROUND

1. Field of the Invention

Embodiments of the present invention relate to methods and systems for making a microelectromechanical system that involve supplying an etchant to etch one or more sacrificial structures.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In some embodiments, a method for making a microelectromechanical systems (MEMS) device is provides. The method may include providing a chamber and an unreleased MEMS device situated therein, the unreleased MEMS device including a sacrificial structure. The method may include supplying an etchant to the chamber to thereby etch the sacrificial structure. The method may include monitoring a process parameter related to the pressure within the chamber as a function of time to thereby provide an indication of the extent of etching of the sacrificial structure. The monitored process parameter may be the change in pressure within the chamber as a function of time. The monitored process parameter may be a change in a time derivative of a within-cycle pressure across cycles. The monitored process parameter may include the temperature within the chamber and/or the change in temperature within the chamber as a function of time. The method may further include discontinuing the supplying of the etchant to the chamber and/or removing at least a portion of the gases from the chamber. In some embodiments, the method includes conducting one or more additional cycles by repeating at least supplying an etchant to the chamber to thereby etch the sacrificial structure, monitoring a process parameter related to the pressure within the chamber as a function of time to thereby provide an indication of the extent of etching of the sacrificial structure and removing at least a portion of the gases from the chamber. An initiation of an additional cycle may be discontinued upon the providing of the indication. The indication may be provided when the monitored process parameter corresponding to a specific time relative to the beginning of an additional cycle crosses a pre-selected threshold and/or when the monitored process parameter corresponding to a specific time relative to the beginning of an additional cycle crosses a pre-selected second threshold after having already crossed a pre-selected first threshold. A monitored process parameter measured at a specific time relative to the beginning of the first or additional cycle may be compared to a monitored process parameter measured at the same specific time relative to the beginning of a different additional cycle to thereby provide the indication. The indication may be provided when the monitored process parameter crosses a pre-selected threshold.

The pre-selected threshold may be about zero. The pre-selected threshold may be about 1%, about 5% or about 10% of a maximum process parameter relative to an initial process parameter. The pre-selected threshold may be about 105% of a first pressure expected if the etchant does not react with another substance. The pre-selected threshold may be a pressure change of about 0.2 mT per second or about −0.2 mT per second.

The unreleased MEMS device may include an unreleased interferometric modulator. The unreleased MEMS device may include a substrate. The unreleased MEMS device may include one or more first layers positioned over the substrate. The unreleased MEMS device may include a sacrificial layer including a sacrificial structure positioned over the one or more first layers. The unreleased MEMS device may include one or more second layers positioned over the sacrificial layer. The one or more first layers may include a first electrode. The one or more second layers may include a second electrode. A reaction between the etchant and the sacrificial structure may produce primarily gaseous products. The sacrificial structure may include molybdenum. The etchant may include xenon difluoride. A method described herein may further include positioning one or more additional unreleased MEMS devices in the chamber, the additional unreleased MEMS devices including additional one or more sacrificial structures. A MEMS device may be manufactured by a method described herein.

In some embodiments, an etching system is provided. The etching system may include an etching chamber configured to provide an etchant to the chamber and to house an unreleased MEMS device including a sacrificial structure. The etching system may include a parameter monitor configured to monitor a parameter related to the pressure within the chamber. The etching system may include a component configured to indicate the extent of etching of the sacrificial structure based on changes in the parameter as a function of time. The parameter may be the pressure within the chamber. The parameter may be the change in a time derivative of a within-cycle pressure across cycles. The etching chamber may be configured to provide the etchant to the chamber in a plurality of cycles. The component may be further configured to compare the changes in the parameter across the cycles. The component may be configured to determine when a change in the parameter as a function of time crosses a pre-selected threshold and/or to indicate when to discontinue the providing of the etchant. The component may be configured to compare the change in the parameter as a function of time at a particular time relative to the cycle onset across cycles and/or to identify a cycle in which the change in the parameter as a function of time crosses a threshold. The component may be configured to identify a cycle in which the change in the parameter as a function of time crosses a threshold. The component may include a computer.

In some embodiments, a computer-readable medium having computer-executable instructions thereon for determining a stop etching time is provided. The instructions may include receiving a plurality of input parameters related to the pressure within an etching chamber housing an unreleased MEMS device including a sacrificial structure. Each of the input parameters may correspond to an etching cycle and/or a time relative to the onset of the etching cycle. The instructions may include determining pressure-derivative parameters, which may be determined by calculating the change of the input parameter with respect to the time relative to the onset of the etching cycle. The instructions may include outputting an indicator of the extent of etching of the sacrificial structure by comparing at least one pressure-derivative parameter corresponding to a specified time relative to the onset of the corresponding etching cycle to a threshold, and the instructions may further include determining a cycle in which one of the at least one pressure-derivative parameter is below the threshold and in which the corresponding pressure-derivative parameter from the preceding trial is above the threshold. The indicator may include a time in which an amount of etching has been or is expected to be achieved. The amount may correspond to etching of approximately all of the sacrificial structure. The threshold may be approximately zero.

In some embodiments, an optical device formation system is provided. The optical device formation system may include means for providing an etchant to interact with a sacrificial structure of an unreleased MEMS device, wherein the means for providing the etchant to interact with the sacrificial structure of the unreleased MEMS device may include an etching chamber. The optical device formation system may include means for monitoring a parameter related to pressure changes at least partially attributable to the interaction of the etchant with the sacrificial structure, wherein the means for monitoring the parameter related to pressure changes at least partially attributable to the interaction of the etchant with the sacrificial structure may include a pressure sensor. The optical device formation system may include means for indicating the extent of etching of the sacrificial structure based on the monitored parameter, wherein the means for indicating the extent of etching of the sacrificial structure based on the monitored parameter may include a computer. The means for indicating the extent of etching of the sacrificial structure based on the monitored parameter may include means for indicating a time in which a specific amount of etching of the sacrificial structure has been achieved. The means for indicating a time may include a computer. The specific amount may be approximately all of the sacrificial structure. The time may include an etching cycle. The means for indicating the extent of etching of the sacrificial structure based on the monitored parameter may include means for determining an etching cycle for which a change in the monitored parameter with respect to time fall below a specified threshold. The means for determining an etching cycle may include a computer. The threshold may be approximately zero.

These and other embodiments are described in greater detail below.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Sacrificial structures may be formed during the manufacturing of a MEMS device. The sacrificial structures may later be removed to form, for example, a cavity. During the manufacturing process, a device that contains a sacrificial structure may be positioned in a chamber. An etchant can be introduced to the chamber in order to react with the sacrificial structure to form gaseous products. These gaseous products may be removed from the chamber and etchant may again be supplied to the chamber. This cycle may be repeated until the sacrificial structure is removed. In embodiments of this invention, a process parameter related to the pressure within the chamber is monitored as a function of time to thereby provide an indication of the extent of etching of the sacrificial structure. In some embodiments, the indication results in the discontinuation of the supply of etchant to the chamber.

Figure 1:
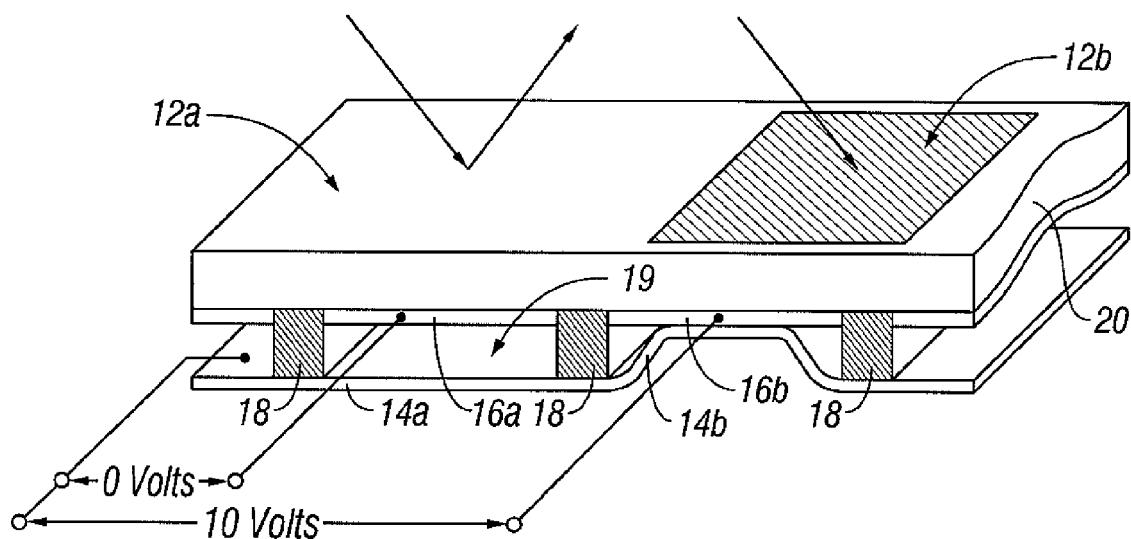
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum and/or silver may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
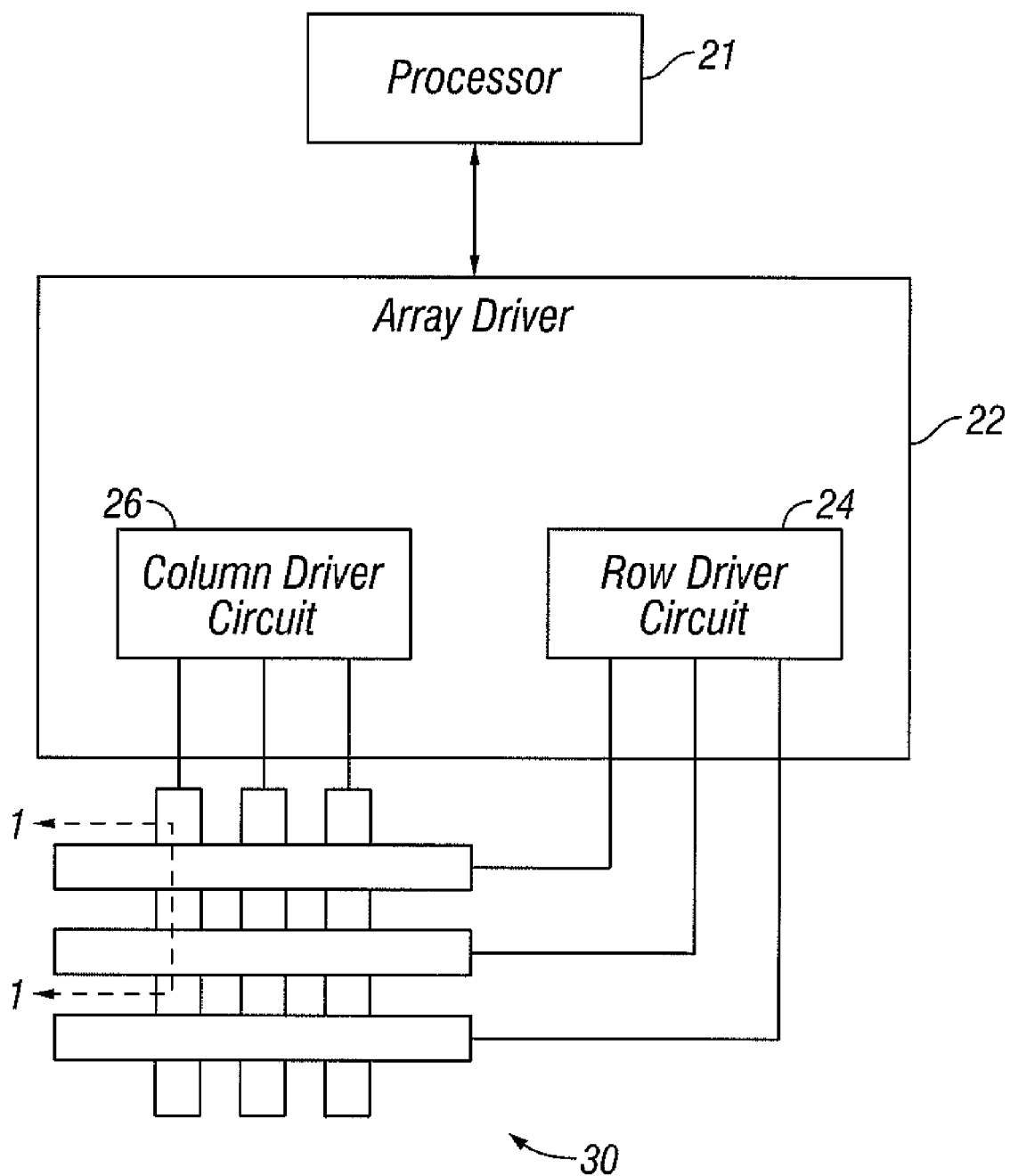
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
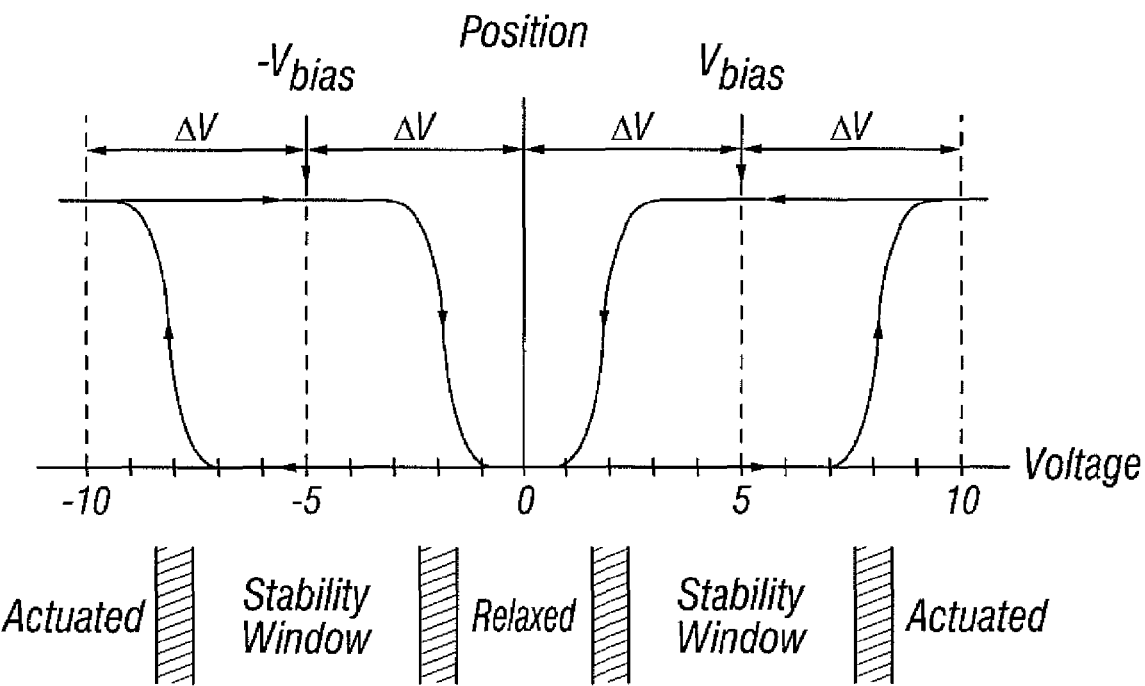
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
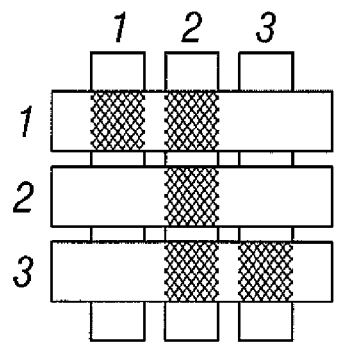
FIG. 5A illustrates one exemplary frame of display data in the 3×3 interferometric modulator display of FIG. 2.
Figure 5B:
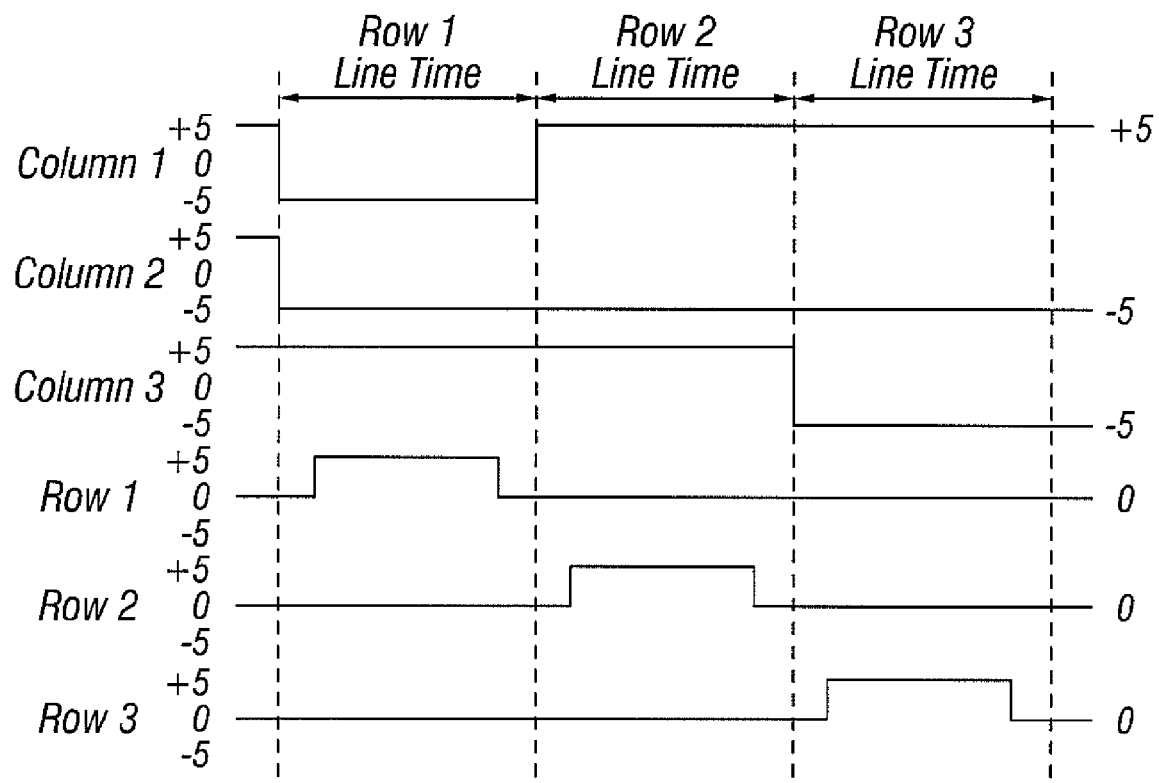
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
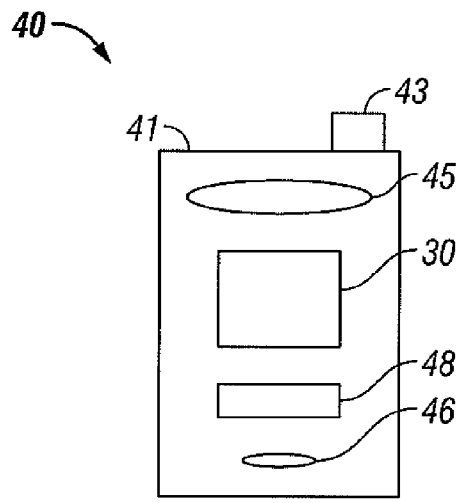
FIGS. 6A and 6B are system block diagrams illustrating an embodiment of a visual display device comprising a plurality of interferometric modulators.
Figure 6B:
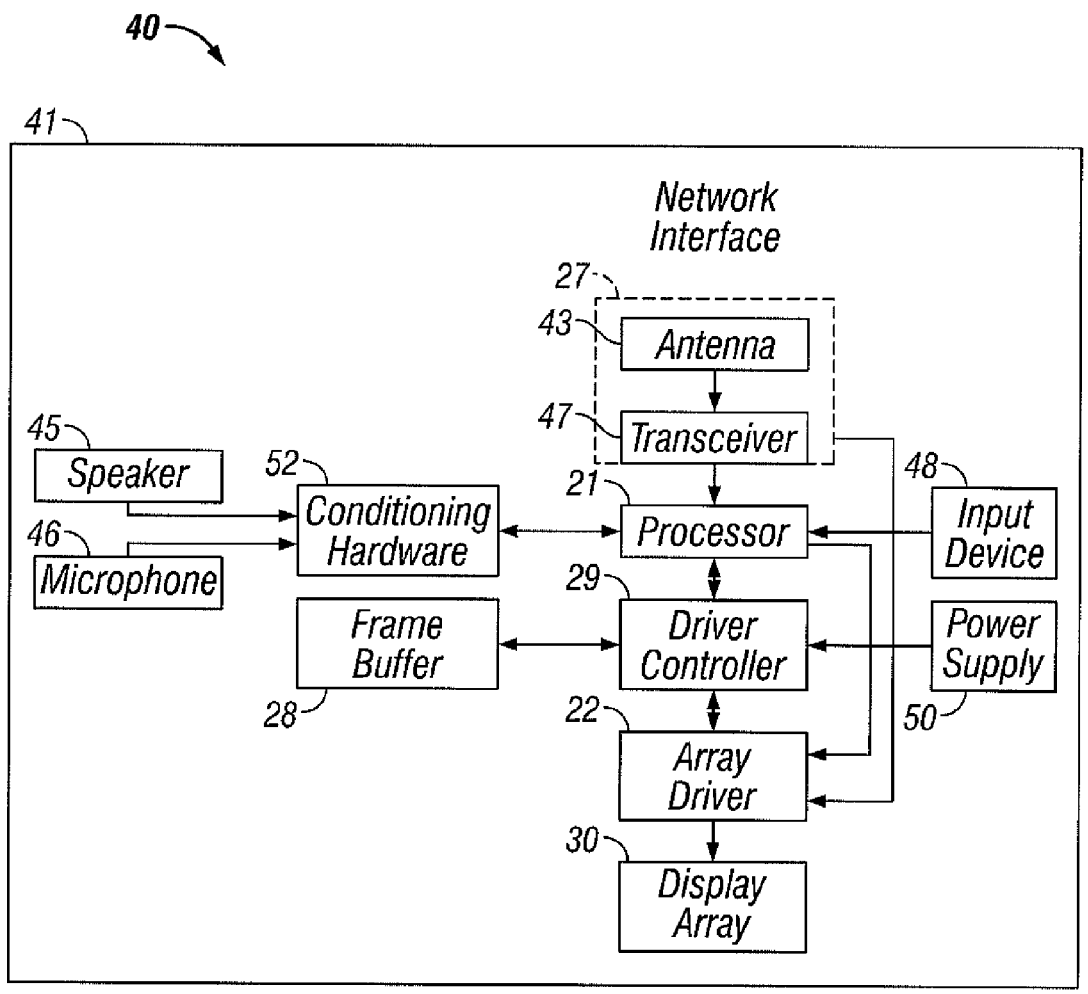

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a memory device such as a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
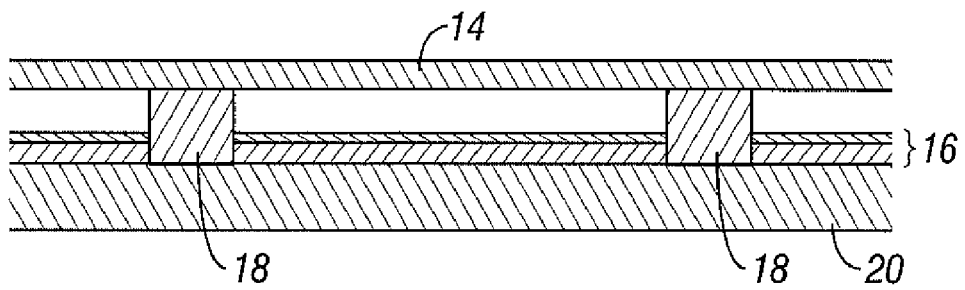
FIG. 7A is a cross section of the device of FIG. 1.
Figure 7B:
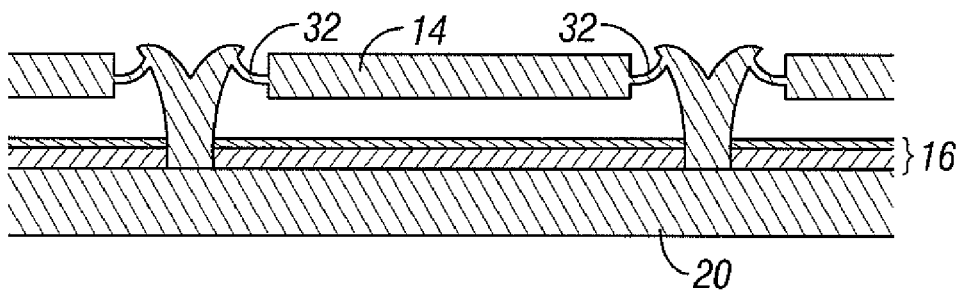
FIG. 7B is a cross section of an alternative embodiment of an interferometric modulator.
Figure 7C:
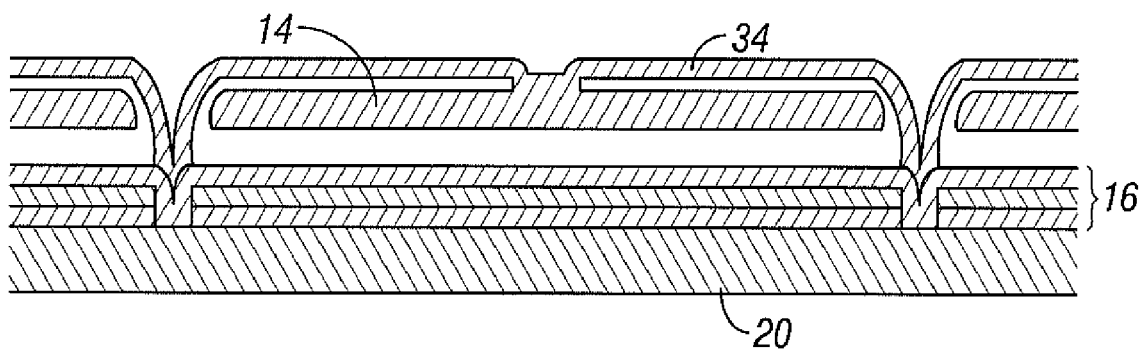
FIG. 7C is a cross section of another alternative embodiment of an interferometric modulator.
Figure 7D:
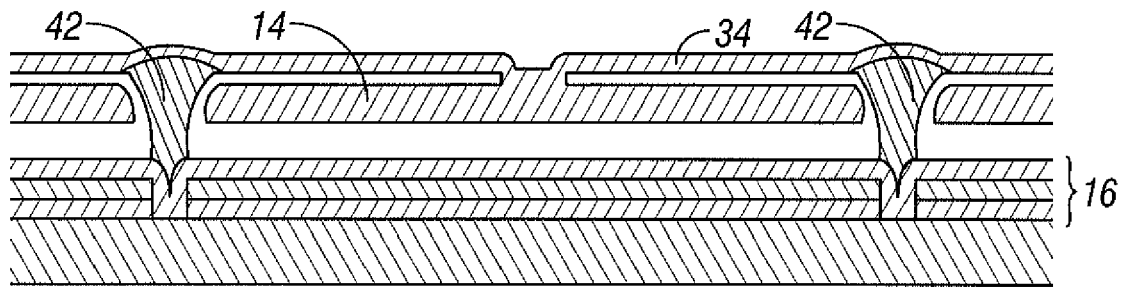
FIG. 7D is a cross section of yet another alternative embodiment of an interferometric modulator.
Figure 7E:
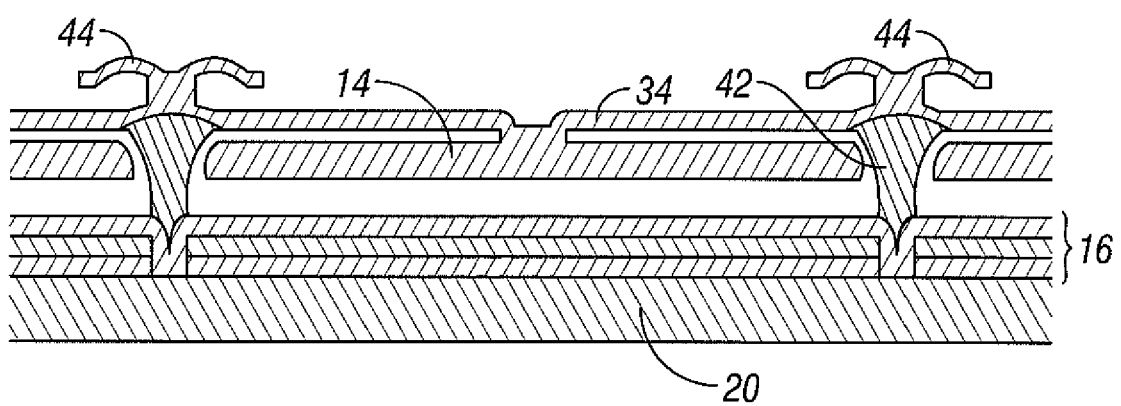
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
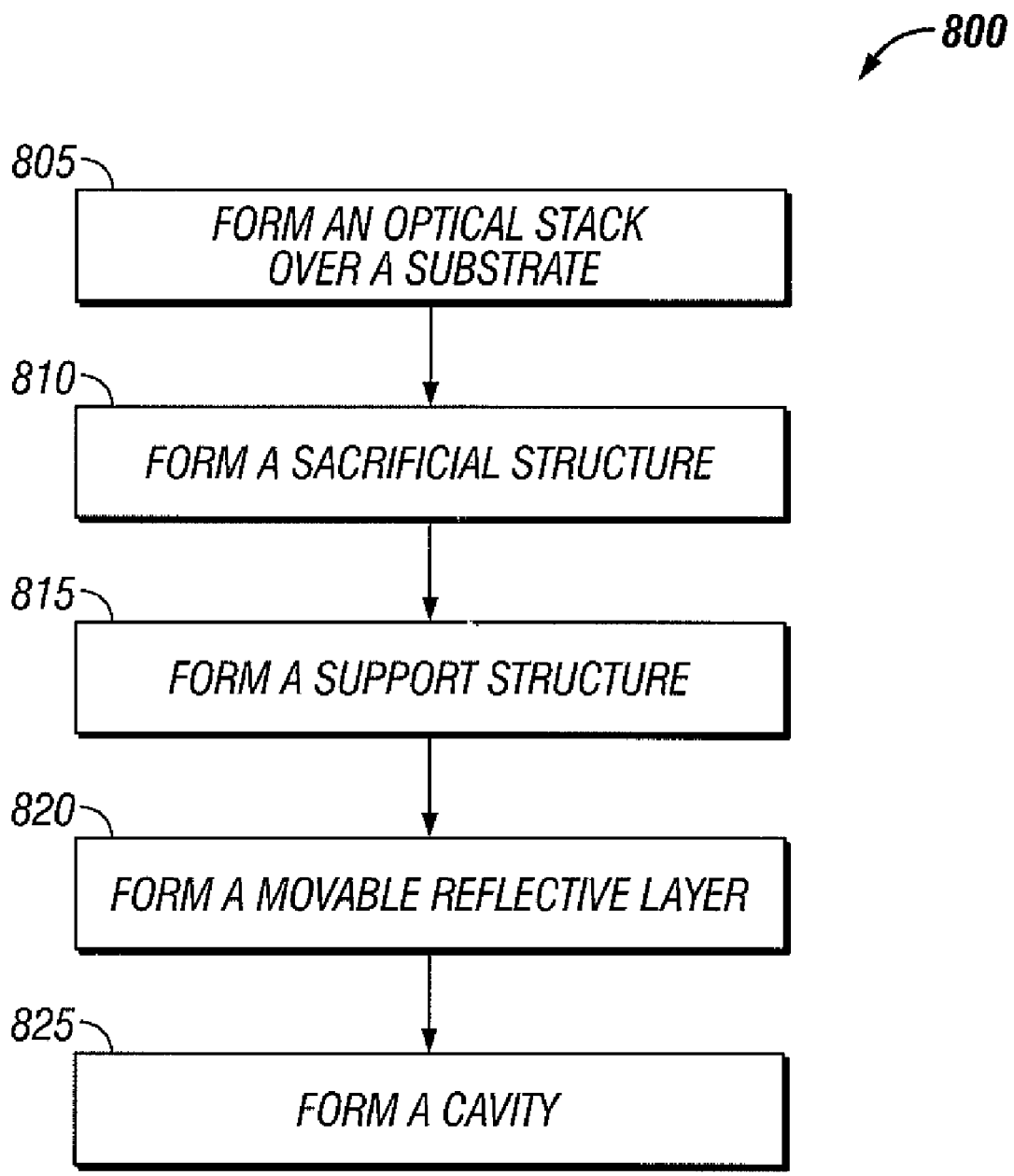
FIG. 8 is a flow diagram illustrating certain steps in an embodiment of method of making an interferometric modulator.

FIG. 8 illustrates certain steps in an embodiment of a manufacturing process 800 for an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. In some embodiments, the optical stack 16 includes an insulating or dielectric layer that is deposited over one or more metal layers (e.g., reflective and/or conductive layers). In some embodiments, the insulating layer is the uppermost layer of the optical stack 16.

The process 800 illustrated in FIG. 8 continues at step 810 with the formation of a sacrificial structure. The sacrificial structure may comprise a sacrificial layer and may be formed over the optical stack 16. The sacrificial structure is later removed (e.g., at step 825) to form the cavity 19 as discussed below and thus the sacrificial structure is not shown in the resulting interferometric modulator 12 illustrated in FIG. 1. The formation of the sacrificial structure may include deposition of a $XeF_2$-etchable material such as molybdenum or amorphous silicon, in a thickness selected to provide, after subsequent removal, a cavity 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7. The formation of the post 18 may include the steps of patterning the sacrificial structure to form a support structure aperture, then depositing a material (e.g., a polymer) into the aperture to form the post 18, using a deposition method such as PECVD, thermal CVD, or spin-coating. In some embodiments, the support structure aperture formed in the sacrificial structure extends through both the sacrificial structure and the optical stack 16 to the underlying substrate 20, so that the lower end of the post 18 contacts the substrate 20 as illustrated in FIG. 7A. In other embodiments, the aperture formed in the sacrificial structure extends through the sacrificial structure, but not through the optical stack 16. For example, FIG. 7D illustrates the lower end of the support post plugs 42 in contact with the optical stack 16.

The process 800 illustrated in FIG. 8 continues at step 820 with the formation of a movable reflective layer such as the movable reflective layer 14 illustrated in FIGS. 1 and 7. The movable reflective layer 14 may be formed over the sacrificial structure. The movable reflective layer 14 may be formed by employing one or more deposition steps, e.g., reflective layer (e.g., aluminum, aluminum alloy, silver, silver alloy) deposition, along with one or more patterning, masking, and/or etching steps. As discussed above, the movable reflective layer 14 is typically electrically conductive, and may be referred to herein as an electrically conductive layer. In some embodiments, the reflective layer 14 comprises aluminum. In some embodiments, the reflective layer 14 comprises silver. Since the sacrificial structure is still present in the partially fabricated interferometric modulator formed at step 820 of the process 800, the movable reflective layer 14 is typically not movable at this stage. A partially fabricated interferometric modulator that contains a sacrificial structure may be referred to herein as an "unreleased" interferometric modulator.

The process 800 illustrated in FIG. 8 continues at step 825 with the formation of a cavity, e.g., a cavity 19 as illustrated in FIGS. 1 and 7. The cavity 19 may be formed by exposing the sacrificial structure (formed at step 810) to an etchant. For example, an etchable sacrificial material such as molybdenum or amorphous silicon may be removed by dry chemical etching, e.g., by exposing the sacrificial structure to a gaseous or vaporous etchant, such as vapors derived from solid xenon difluoride ($XeF_2$) for a period of time that is effective to remove the desired amount of material, typically selectively relative to the structures surrounding the cavity 19. The exposure of the sacrificial structure to the etchant may be conducted in an enclosure or etching chamber (not shown in FIG. 8). Suitable etching chambers are commercially available, e.g., Xetch® $XeF_2$ etching systems are available from XACTIX, Pittsburgh, Pa. Other etching methods, e.g. wet etching and/or plasma etching, may also be used. Since the sacrificial structure is removed during step 825 of the process 800, the movable reflective layer 14 is typically movable after this stage. After removal of the sacrificial structure, the resulting fully or partially fabricated interferometric modulator may be referred to herein as a "released" interferometric modulator.

As noted above with respect to step 825 of the process 800, the sacrificial structure of an interferometric modulator can be removed by supplying an etchant to a chamber in which the unreleased interferometric modulator is situated. The etchant can then react with the sacrificial structure to form gaseous products. For example, a xenon difluoride gaseous etchant can react with a molybdenum sacrificial structure to form the gaseous products of molybdenum hexafluoride and xenon. It can be advantageous to monitor the extent of etching. Under-etching may interfere with the functioning of the device. For example, under-etching may reduce the cavity depth of an interferometric modulator, which could affect the wavelength of light reflected from the device. Over-etching may add additional time and/or expense to the manufacturing process. Still, monitoring the extent of etching can be difficult. The devices may be small, making it difficult to determine whether etching is complete. Additionally, components of the device may be configured such that it is difficult to view the sacrificial structure as it is being etched.

Figure 12:
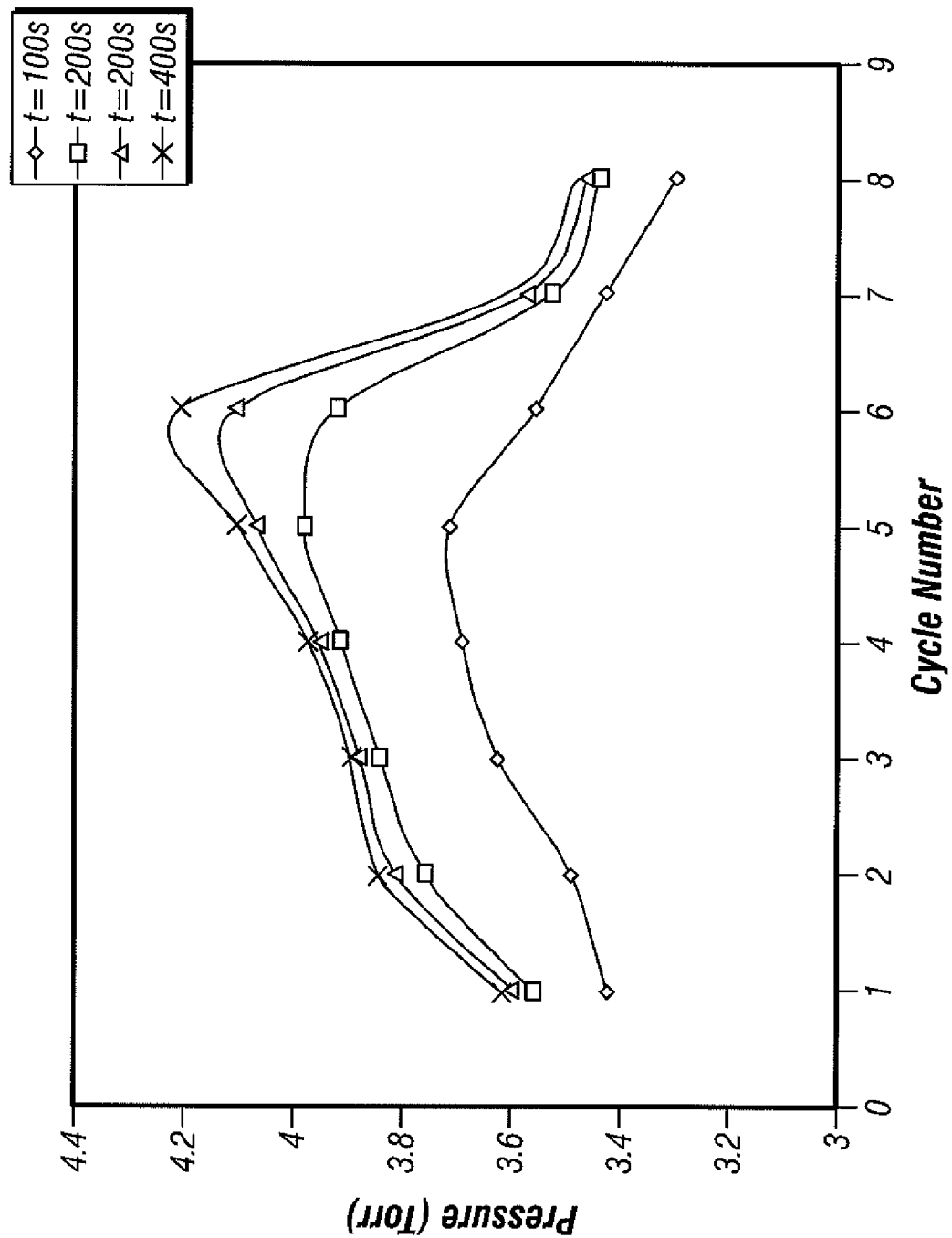
FIG. 12 is the pressure within an etching chamber across etching cycles.

In some embodiments, methods and/or systems relate to monitoring the extent of etching of a sacrificial structure by an etchant. The etchant may be provided to an etching chamber housing a MEMS device (e.g., an interferometric modulator) in one or more cycles. An indication of the extent of etching may be obtained by monitoring the chamber pressure, or a variable related to the pressure, within a particular cycle and/or across cycles. The pressure increase during mid-stage cycles may be greater during than early stage and/or late-stage cycles. While not wishing to be bound to any particular theory, it is believed that as the etchant reacts with the sacrificial structure, the number of moles of gas and/or the temperature within the chamber increases, resulting in an increase in the pressure within the chamber during the cycle. During early-stage and late-stage cycles, the surface area of the sacrificial structure available for reaction with the etchant may be reduced as compared to mid-stage cycles, e.g., as illustrated in FIG. 12.

As described in more detail below, the extent of etching may be determined by monitoring the chamber pressure across cycles and comparing it to two (or more) thresholds. As the surface area of the sacrificial structure increases across early-stage cycles, the pressure may rise above a first threshold. As the surface area of the sacrificial structure reaches a maximum and then begins to decrease during mid-stage and late-stage cycles, the pressure may pass through a corresponding maximum and then fall below a second threshold. The extent of etching may be determined by monitoring the time derivative of the within-cycle pressure and comparing it to the two thresholds. As the surface area of the sacrificial structure increases across cycles, the reaction rate may increase, thereby causing the derivative of the within-cycle pressure to rise above the first threshold. As the surface area of the sacrificial structure decreases as the sacrificial structure is removed, the reaction rate may decrease, thereby causing the derivative of the within-cycle pressure to fall below a second threshold.

The extent of etching may be determined in various ways. For example, the extent of etching may be determined by monitoring a change in the chamber pressure across etching cycles or by monitoring a change in the derivative of the within-cycle pressure across cycles. As the extent of etching nears completion, the number of moles of gas may remain substantially constant throughout each cycle. Thus, the pressure at a post-initial time point of the cycle, which may be substantially equal to the pressure at an initial time point of the cycle, may remain relatively constant across cycles. Additionally, the derivative of the pressure, which may be substantially equal to zero, may remain relatively constant across cycles. Therefore, the change in the absolute pressure across cycles or the change in the derivative of the within-cycle pressure across cycles may approach zero as etching nears completion.

Figure 9:
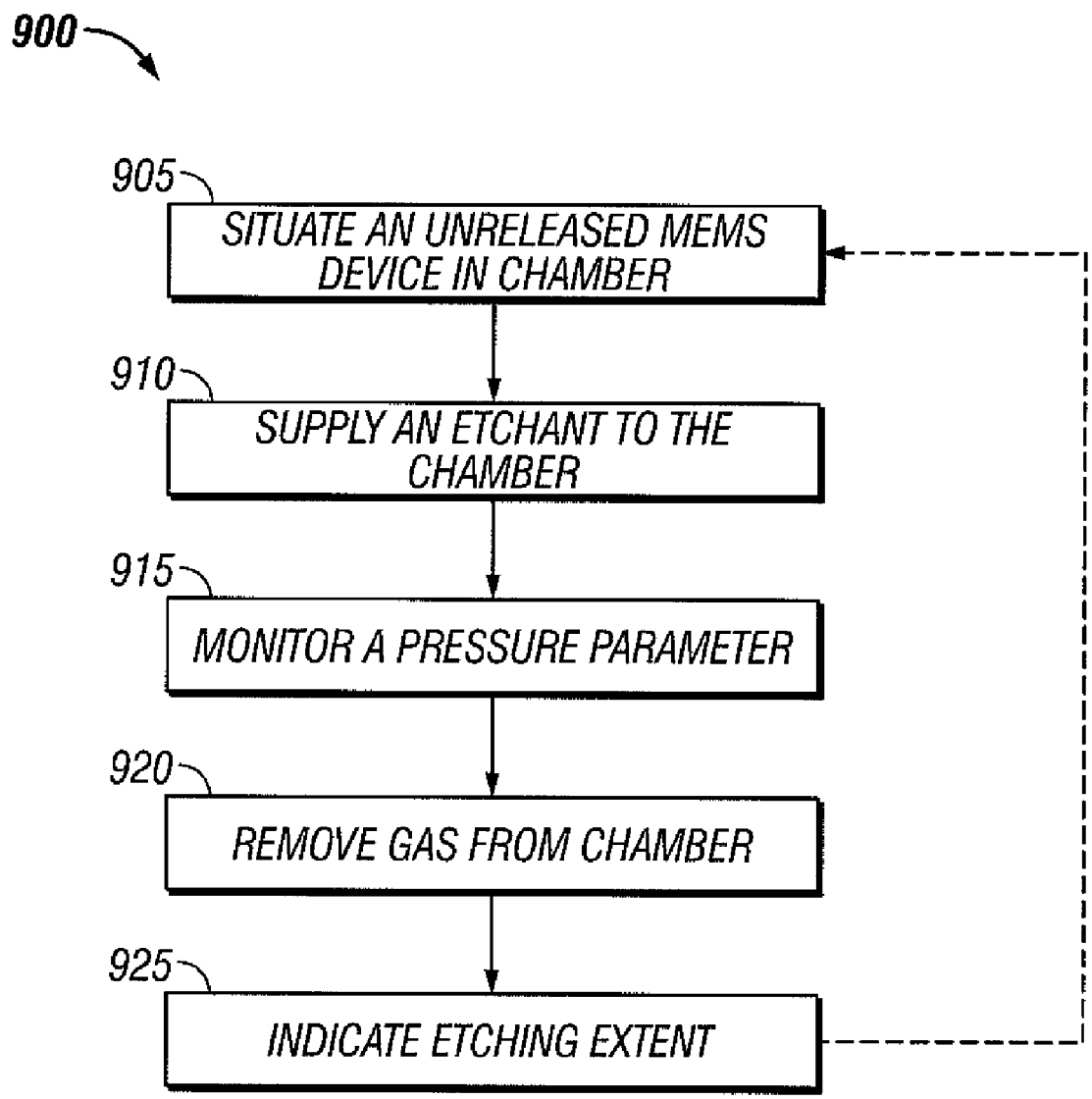
FIG. 9 is a flow diagram illustrating certain steps in an embodiment of forming a cavity in a MEMS device.

FIG. 9 illustrates certain steps in an embodiment of a process 900 for forming a cavity. Such steps may be present in one or more steps of a process for manufacturing, e.g., step 825 of the process 800 illustrated in FIG. 8, along with other steps not shown in FIG. 9.

Figure 10:
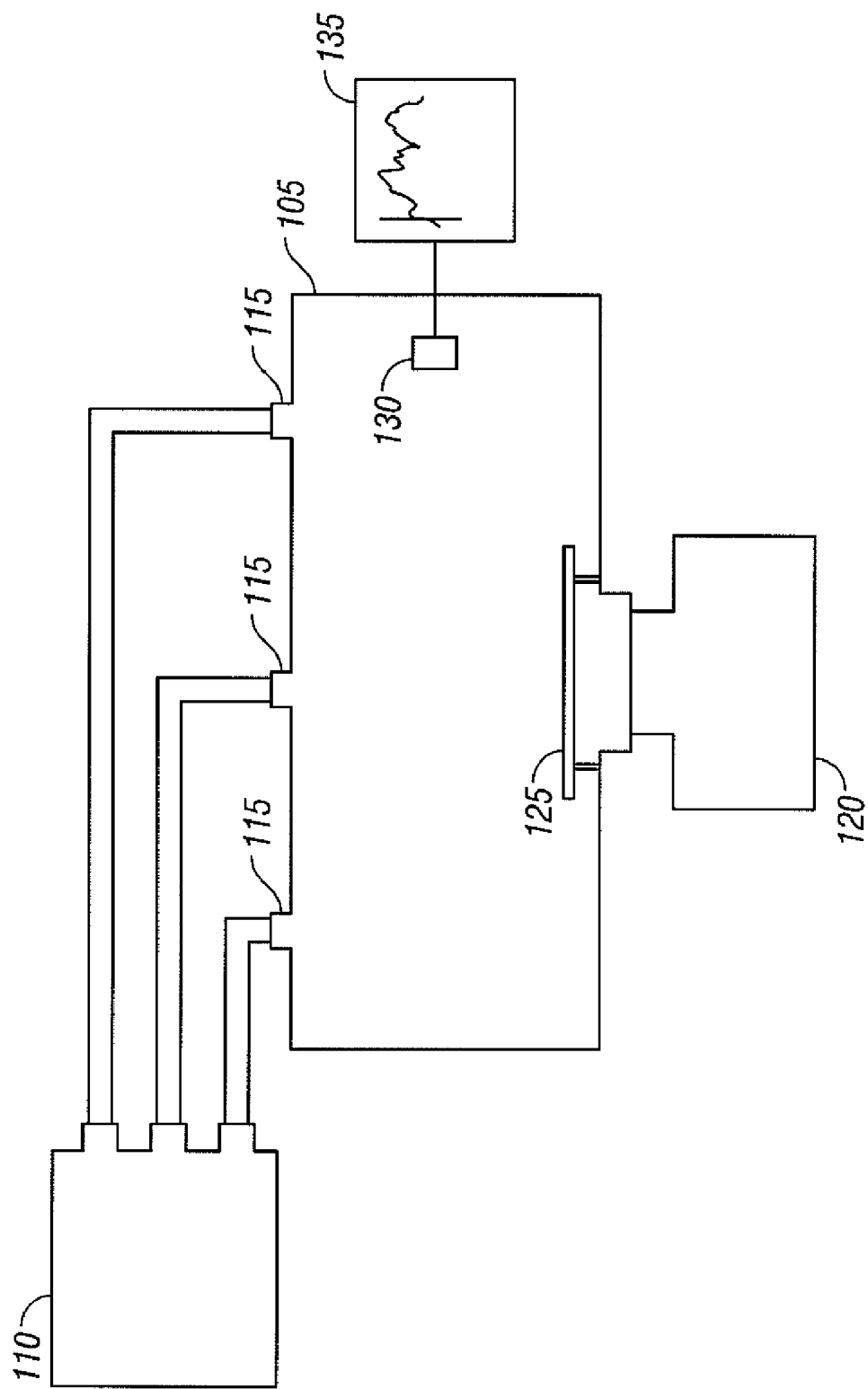
FIG. 10 is a system block diagram illustrating one embodiment of an etch system.

As illustrated in FIG. 9, the process 900 begins at step 905 by situating an unreleased MEMS device comprising a sacrificial structure in a chamber. Any suitable etch chamber may be used. A schematic representation of an etch system 100 that comprises an etch chamber 105 is shown in FIG. 10. The etch chamber 105 may be configured to provide an etchant from an etchant supply 110 to the etch chamber 105 and to house an unreleased MEMS device comprising a sacrificial structure. The etch chamber 105 may comprise inlets 115, by which etchant can be supplied to the chamber 105. The etch chamber 105 may comprise a vacuum pump system 120, which may be configured to remove gases from the etching chamber 105. The etch chamber 105 may further comprise a wafer platter 125 on which an unreleased MEMS device (not shown in FIG. 10) may be situated. In some embodiments, the unreleased MEMS device is fully or partially formed in the chamber 105. In other embodiments, the unreleased MEMS device is formed outside of the chamber 105 and moved into the chamber 105. In some embodiments, the unreleased MEMS device comprises a substrate. The MEMS device may further comprise one or more first layers positioned over the substrate. The one or more first layers may comprise one or more of an insulating layer, an absorption layer, and an electrode layer. The device may further comprise a sacrificial layer comprising the sacrificial structure positioned over the one or more first layers and may further comprise one or more second layers positioned over the sacrificial layer. The one or more second layers may comprise an electrode. The unreleased MEMS device may comprise an unreleased interferometric modulator.

The process 900 illustrated in FIG. 9 continues at step 910 with the supplying of an etchant to the chamber 105. The etchant may be supplied to the chamber in various ways. For example, the etchant may be supplied through the inlets 115 of the chamber 105. The etchant may be chosen to react with the sacrificial structure of the MEMS device. For example, the etchant may comprise xenon difluoride if the sacrificial structure comprises molybdenum, such that the gaseous reaction products of xenon gas and molybdenum hexafluoride can form upon contact between the etchant and the sacrificial structure. Supplying the etchant to the chamber may comprise creating a lower pressure environment in the chamber prior to or during flowing the etchant to the chamber. For example, the vacuum pump system 120 may be used to partially evacuate the chamber 105, thereby facilitating flow of the etchant from the etchant supply 110 through the inlets 115. As the etchant is supplied to the chamber 105, the pressure can increase. In some embodiments, the flow rate of the etchant is pre-determined. In other embodiments, the flow rate is determined by a method and/or system described herein.

The supplied etchant may react with the sacrificial structure of the MEMS device. In some embodiments, one or more external parameters are held approximately constant during this reaction. For example, after an amount of etchant has been supplied to the chamber 105, inlets 115 and outlets of the chamber 105 may be closed (e.g., using a valve, not shown in FIG. 10), and the influence of external factors may be reduced, such that, for example, the pressure within the chamber 105 is effected substantially only by the reaction between the etchant and the sacrificial structure. The rate and the extent of the reaction in such a closed system may depend on various factors, such as the temperature, the etchant pressure, the surface area of the sacrificial structure, the volume of the sacrificial structure and the volume of the etching chamber 105. In some instances, substantially all of the etchant reacts with the sacrificial structure, whereas in other instances, only a portion of the etchant reacts with the sacrificial structure. Only a portion of the etchant may react with the sacrificial structure, for example, if the etchant is removed before the reaction is complete and/or if the sacrificial structure is completely removed before all of the etchant has participated in the reaction. In some embodiments, forming a closed system comprises using the vacuum pump system 120 to lower the pressure in the chamber 105 to a pre-selected value, e.g., a chamber pressure in the range of about 0.01 to about 10 Torr, then the vacuum is discontinued, e.g., by closing a valve (not shown) situated between the vacuum pump system 120 and the chamber 105. An etchant may then be supplied to the chamber 105 from the etchant supply 110 through the inlets 115 in an amount that increases the chamber pressure to a pre-selected value, e.g., a chamber pressure in the range of about 0.05 to about 15 Torr, at which point the flow of the etchant to the chamber 105 may be terminated, e.g., by closing a valve (not shown) situated between the etchant supply 110 and the chamber 105. In some embodiments, the etchant is supplied to the chamber 105 one time or in a single stage. In other embodiments, the etchant is supplied in multiple stages, and in still other embodiments the system is open, e.g., the etchant is continuously supplied.

The process 900 illustrated in FIG. 9 continues at step 915 by monitoring a process parameter related to the pressure within the chamber 105. The parameter may be related to the reaction between the etchant and the sacrificial layer. For example, the reaction of xenon difluoride and molybdenum results in the formation of about four moles of gaseous reaction products per about three moles of xenon difluoride starting product, in accordance with the following chemical equation:

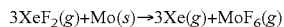

$$3XeF_2(g)+Mo(s) \rightarrow 3Xe(g)+MoF_6(g)$$

Thus, in a closed system embodiment, the number of moles of gas in the chamber 105 may increase as the etchant reacts with the sacrificial layer, thereby increasing the pressure, and/or the reaction may produce heat, which may increase chamber pressure in accordance with the relationship $PV=nRT$ where P is pressure, V is volume, n is the number of moles of gas, R is a constant and T is temperature. The pressure within the chamber 105 may therefore increase as the reaction progresses.

Figure 11:
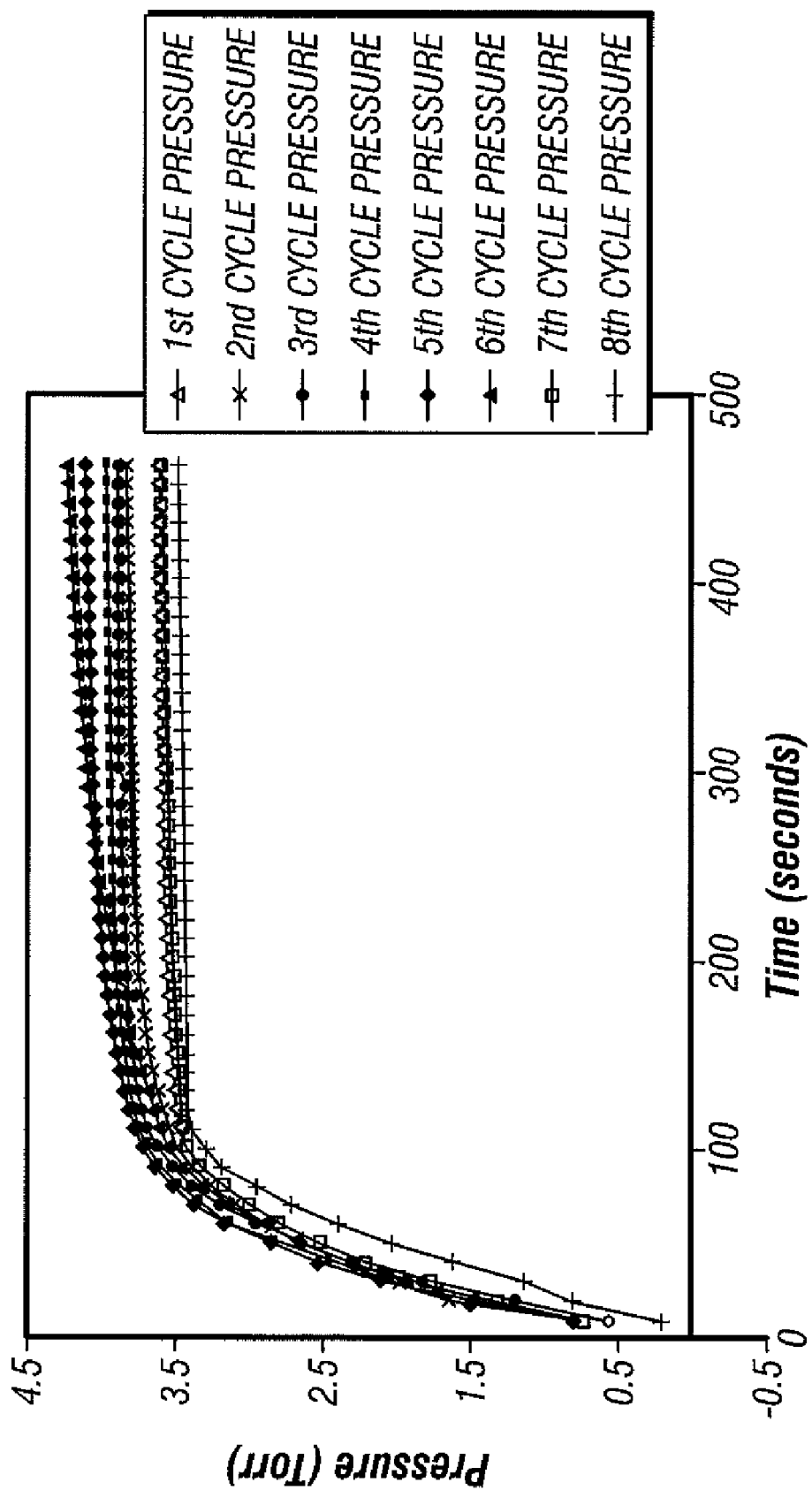
FIG. 11 is the pressure within an etching chamber as a function of time for a plurality of etching cycles.

The process parameter that is monitored at step 915 may comprise the pressure within the chamber 105 or a change (e.g., a time derivative) in the pressure within the chamber during a cycle as a function of time. For example, FIG. 11 illustrates the pressure as a function of time for the embodiment described in Example 1 below. Those skilled in the art will understand from FIG. 11 that after the flow of etchant into the chamber is terminated (at t=about 100 seconds), the pressure within the chamber continues to increase as a function of time. FIG. 11 shows that the both the pressure and the pressure increase (which can be determined by comparing differences between the curves for each cycle) after the introduction of etchant to the chamber tends to be most pronounced during the mid-stage cycles (e.g., cycles 4-6). In the later-stage cycles, both the pressure and the amount of increase in pressure after the etchant is introduced becomes lower, providing an indication that the etching is nearly complete. Thus, the amount of within-cycle pressure increase after termination of the supplying of the etchant, e.g., as indicated by the slope of the lines shown in FIG. 11 after t=100 seconds, may be used to determine the extent of etching. If initial conditions are substantially similar across cycles, then a pressure and a pressure derivative may be correlated across cycles.

The process parameter that is monitored at step 915 may comprise a change in the pressure within the chamber 105 across cycles or a change in a time derivative of the within-cycle pressure across cycles. For example, FIG. 12 shows the pressure across cycles at various time points relative to the cycle onset (e.g., t=100 s, 200 s, 300 s and 400 s after cycle onset), for the embodiment described in Example 1 below. As noted above, the pressure increase following the introduction of etchant to the chamber is most pronounced during the mid-stage cycles (e.g., cycles 4-6). The process parameter that is monitored at step 915 may also comprise a temperature parameter (e.g., the temperature or change in temperature as a function of time within the chamber 105) related to the pressure within the chamber 105. In some embodiments, monitoring a change in the pressure or temperature comprises monitoring the pressure or temperature and calculating a change in the pressure or temperature. In some embodiments, changes in the process parameter (e.g., pressure) are measured with respect to a selected time, such as the time relative to the start and/or the termination of the supplying of the etchant in step 910 of process 900. In some embodiments, the process parameter is continuously monitored while in others, it is not. In some embodiments, the parameter is monitored during other steps, such as during step 910 of the process 900.

The process 900 illustrated in FIG. 9 continues at step 920 with the removing of gas from the chamber 105. The removed gas may comprise one or more component gases. For example, the gas may comprise products of the etchant-sacrificial structure reaction. These products may include, for example, xenon gas and/or molybdenum hexafluoride. In some embodiments, the gas comprises the etchant, whereas in other embodiments, it does not. The removing of gas may include removing all of the gas or a portion of the gas from the chamber 105.

The gas may be removed by the vacuum pump system 120 of the chamber 105. In some embodiments, the gas is removed from the chamber 105 one time or in a single stage. In other embodiments, the gas is removed at distinct time points or in multiple stages, and in still other embodiments, the gas is continuously removed. The gas may be removed after a pre-selected period of time has elapsed since the start and/or termination of the supply of the etchant to the chamber 105 in step 910 of process 900.

The process 900 illustrated in FIG. 9 continues at step 925 by indicating the extent of etching of the sacrificial structure. Various ways may be used to indicate the extent of etching. For example, the indication of the extent of etching may be provided manually, e.g., by visually monitoring a pressure gauge and noting a pressure or change in pressure that corresponds to a previously determined extent of etching. The indication of the extent of etching may be provided automatically and/or electronically, e.g., as an electronic signal that is processed by a computer and converted into a form that is communicated to an operator. The indication of the extent of etching may take place at various times and be in various forms. For example, the indication may be provided when the extent of etching crosses or is estimated to cross one or more pre-selected thresholds and/or when the monitored parameter crosses one or more pre-selected thresholds. The indication of the extent of etching may comprise a number and/or may be a binary indication. For example, the number may comprise an estimated percentage or amount of the sacrificial structure that has been removed. The binary indication may indicate whether the extent of etching has passed a threshold or whether the extent of etching is complete. In some embodiments, the binary indication is restricted to one of two indications (e.g., above or below threshold). In other embodiments, the binary indication can include additional indications (e.g., slightly above threshold). In some embodiments, the binary indication comprises an indicator and a lack of an indicator. For example, the indicator may only occur when the estimated etching extent is above a threshold, whereas no indictor may occur when the estimated etching extent is not above the threshold.

In some embodiments, the extent of etching is communicated to an operator, e.g., displayed on a computer display, whereas in others it is not. Indicating the extent of etching may comprise controlling a process step based on the extent of etching. For example, if the extent of etching is above a threshold, the process 900 may continue to repeat a cycle. Repeating a cycle may comprise repeating, for example, at least steps 910, 915 and 920 or at least steps 910, 915, 920 and 925. The process 900 may include the discontinuation of the initiation of a new cycle and/or the discontinuation of the supply of etchant to the chamber 105, which may occur if the extent of etching is not above the threshold. The controlling of a process step may comprise controlling, for example, the flow rate of the etchant supplied to the chamber 105 in step 910 or controlling the time period between the supply of the etchant to the chamber 105 in step 910 and the removing of the gas from the chamber 105 in step 920.

The extent of etching may be determined by analyzing the parameter monitored in step 915 of the process 900. In some embodiments, the extent of etching is determined by comparing a monitored parameter to a threshold. The indication may be provided when the monitored process parameter corresponding to a specific time crosses a pre-selected threshold. For example, the extent of etching may be estimated to be complete when a pressure or change in pressure at a specific time after the etchant is supplied to the chamber 105 is below a specific threshold, e.g., below a pre-selected pressure or pressure change threshold value. The threshold may be pre-determined. For example, if the parameter comprises a change in a variable across cycles and/or a time derivative in a within-cycle variable, the threshold value may be about zero, e.g., a within-cycle and/or across-cycle pressure change of about zero, or may be a pre-selected value, such as a pressure change of about −0.5, −0.2, −0.1, 0.1, 0.2, or 0.5 mTorr per second. The threshold may be determined in various ways, and may be based on one or more previously-monitored parameter values. For example, a first pressure may be identified as one expected if the etchant does not react with another substance. The threshold may be equal to about 100%, about 105% or about 110% of this first pressure. For example, in FIG. 11, the first pressure may be estimated as the pressure at t=100 s. A first pressure may also be determined by monitoring the chamber pressure after a supply of etchant in a separate condition, in which no materials which would react with the etchant are present in the chamber. If there is a minimal amount of a sacrificial structure to react with the etchant, the pressure may remain at an initial pressure throughout the cycle.

The threshold may be about 1%, about 5% or about 10% of a maximum process parameter or about 1%, about 5% or about 10% of a maximum process parameter compared to another process parameter. For example, the maximum pressure may be determined and compared to an initial pressure, which may be the pressure estimated as that when none of the etchant reacts with the sacrificial structure. In FIG. 12, the maximum pressure would occur in cycle 6 at t=400 seconds, when the pressure is equal to 4.21 mTorr. The initial pressure may be estimated as the pressure during the first cycle at t=100 seconds, such that the initial pressure is 3.42 mTorr. The difference in the maximum pressure and the initial pressure is therefore 0.79 mTorr. In one instance, the threshold may be defined as a pressure that is 10% of this difference above the initial pressure. The threshold would then equal 0.79 mTorr·0.1+3.42=3.50 mTorr. This pressure may then be compared to a process parameter monitored at a specific time within the cycle. For example, the process parameter may be the pressure at t=400 seconds. In this instance, the process parameter (3.60 mTorr) of cycle 7 is greater than the threshold (3.50 mTorr) but the process parameter (3.49) of cycle 8 is less than the threshold.

In some embodiments, etchant is supplied to the chamber 105 in a plurality of cycles at step 910 of the process 900, each of which may represent the start of a cycle. The extent of etching may then be determined by comparing the monitored parameter across cycles. The comparison may include monitored process parameters measured at one or more specific times relative to the beginning of a plurality of cycles. For example, the etching may be approaching completion if a monitored parameter is approximately constant across cycles. For example, for the embodiment illustrated in FIG. 12, the pressure differences between cycles 7 and 8 for any given time point are smaller than those between cycles 6 and 7. The extent of etching may be determined by monitoring a parameter which comprises a change in a variable (e.g., chamber pressure and/or the time derivative of the within-cycle pressure) across cycles. The change may be calculated by changes in the values of monitored parameters at substantially similar time points of different (e.g., consecutive) cycles. The extent of etching may be determined by comparing the monitored parameter to a selected threshold (e.g., zero, about 1%, about 5%, about 10%, or about 20% of a maximum observed change in parameters across cycles). For example, in FIG. 12, the largest observed change in pressure is 0.61 mTorr, the difference between the pressures at t=400 seconds for cycles 6 and 7 (calculated as 4.21 mTorr−3.60 mTorr=0.61 mTorr). A threshold may be selected to be a change in pressure that is 20% of the maximum change in pressure, in this instance 0.12 mTorr (calculated as 0.61 mTorr·0.2=0.12 mTorr). The difference between the pressures at t=400 seconds for cycles 7 and 8 is 3.60 mTorr−3.49 mTorr=0.11 mTorr. Therefore, in this instance, cycle 8 would be characterized as crossing the selected threshold, since the change in pressure for t=400 seconds between cycles 7 and 8 (0.11 mTorr) is below the selected threshold (0.12 mTorr).

In some embodiments, the surface area of a sacrificial structure tends to be relatively large during mid-stage etching cycles. The relatively lower surface area during the initial cycles may limit the rate of the etchant reaction, thereby producing a relatively lower chamber pressure or derivative of the within-cycle pressure. Etching may initially increase the surface area, such that mid-stage cycles are associated with an increased chamber pressure or derivative of the within-cycle pressure. As the sacrificial structure is removed, the surface area may again decrease, causing the chamber pressure or derivative of the within-cycle pressure to again decrease. In some embodiments, the indication of the extent of etching indicates when the monitored parameter crosses a threshold in a particular direction (e.g., when the monitored parameter falls below a selected threshold). For example, in FIG. 12, the extent of etching may be indicated when the pressure at t=400 s falls below 3.8 mTorr, which would occur during cycle 7.

In instances in which the etchant is supplied in a plurality of cycles, gas may be removed from the chamber 105 in a plurality of cycles at step 920 of the process 900. A period of time, which may be fixed or variable, may elapse between the beginning of a cycle and the removal of gas from the chamber 105. The period of time may be an estimate or an overestimate of a time period required for all of the supplied etchant to react with the sacrificial structure. In some embodiments, the period of time may be an estimate of a time period required for a threshold amount of the supplied etchant to react with the sacrificial structure.

In some instances, when the etchant is supplied in a plurality of cycles, initially, the sacrificial structure may be characterized by a relatively small surface area. Therefore, the rate of the reaction between the etchant and the sacrificial structure may be relatively slow. The pressure may increase as the reaction progresses. The reaction from the initial cycles may increase the surface area. Therefore, in subsequent cycles, the rate of the reaction and the corresponding rate of pressure changes may increase. However, as the majority of the sacrificial structure is removed, the surface area will again decrease, which may cause the rate of the reaction and the corresponding rate of pressure changes to decrease. Therefore, etching may be approximated to be complete after such changes in pressure are observed.

In instances in which the etchant is supplied in a plurality of cycles, the extent of etching can be determined by estimating the amount of etchant remaining after a time period. For example, initially an etchant may react with a sacrificial structure to form gaseous products such that after some time period no etchant remains in the chamber 105. During later cycles, the sacrificial structure may be entirely removed and the etchant may therefore remain after the same time period. Changes in the etchant concentration may be estimated by using a monitored parameter, such as the monitored parameter related to pressure from step 915. The time period may be a pre-determined time period, a dynamically determined time period, or a time period determined based on previous cycles.

In some embodiments, the process 900 further comprises positioning one or more additional unreleased MEMS devices in the chamber 105, the additional unreleased MEMS devices comprising additional one or more sacrificial structures. In some embodiments, additional etchant is supplied to the chamber 105 to etch the additional one or more sacrificial structures. The indicating of the extent of etching from step 925 from the first MEMS device may be used to at least partially control the supply of additional etchant to the cycles or the initiation of additional cycles.

As shown in FIG. 10, in some embodiments, the etch system 100 comprises a parameter monitor 130. The parameter monitor 130 may be configured to monitor a parameter related to the pressure within the etch chamber 105. The parameter monitor 130 may comprise, for example, a pressure monitor (e.g., a pressure gauge) and/or a temperature monitor (e.g., a thermocouple or thermometer).

The etch system 100 may comprise a component 135 (e.g., a computer) configured to indicate the extent of etching of the sacrificial structure of the unreleased MEMS device. The component 135 may be operably connected to the parameter monitor 130. The extent of etching may be based on changes in a parameter monitored by the parameter monitor 130 as a function of time. In embodiments in which the etchant is supplied to the chamber 105 in a plurality of cycles, the component 135 may further be configured to compare changes in the parameter across cycles. In some embodiments, the component 135 may be configured to determine when the parameter or a change in the parameter as a function of time crosses a threshold. The threshold may be pre-selected or may be partially or completely determined based on previously monitored parameter values. In some embodiments, the component 135 is configured to determine when the parameter or a change in the parameter as a function of time crosses two thresholds (e.g., rising above a first threshold and subsequently falling below a second threshold). The component 135 may be further configured to indicate the extent of etching. The component 135 may indicate when to discontinue the providing of the etchant or the initiation of a new cycle. The component 135 may be configured to compare the parameter or changes in the parameter as a function of time at a particular time relative to the cycle onset across cycles. The component 135 may be configured to identify a cycle in which a parameter or change in the parameter as a function of time crosses a threshold. The crossing of the threshold may comprise falling below the threshold.

In some embodiments, the component 135 comprises a computer. In some embodiments, the etching system 100 further comprises a display, such as a computer monitor that may visually indicate the extent of etching as determined by the component 135. In some embodiments, the etch system 100 further comprises an input device. The input device may comprise, for example, a keyboard. In an embodiment, the component 135 comprises a computer system that includes a computer monitor and a keyboard. The input device may be configured to receive threshold parameters from the user. The component 135 may be configured to control and/or partially control any process step disclosed herein. For example, the component 135 may be configured to control supplying an etchant to a chamber, monitoring a process parameter, and/or removing at least a portion of the gases from the chamber. A computer-readable medium having computer-executable instructions thereon may be installed on the component 135. The instructions may be used to control or partially control any and/or all parts of the etch system 100 and/or the process 900.

In some embodiments, a computer-readable medium having computer-executable instructions thereon for determining a stop etching time is provided. The computer-readable medium may be installed on the component 135. The instructions may comprise receiving a plurality of input parameters related to the pressure within an etching chamber housing an unreleased MEMS device comprising a sacrificial structure. Each of the input parameters may correspond to an etching cycle and a time relative to the onset of the etching cycle. The input parameters may comprise the pressure within the etching chamber or any other parameter related to the pressure as described herein. The instructions may comprise determining pressure-derivative parameters by calculating the change of the input parameter with respect to the time relative to the onset of the etching cycle. As an example, the pressure-derivative parameters may comprise changes in the pressure or in the temperature within the chamber as function of time. The instructions may comprise outputting an indicator of the extent of etching of the sacrificial structure by comparing at least one input parameter or pressure-derivative parameter corresponding to a specified time relative to the onset of the corresponding etching cycle to a threshold. The threshold may be approximately zero or may be determined by a parameter monitored in a previous trial. The instructions may comprise outputting an indicator of the extent of etching of the sacrificial structure by comparing at least one pressure-derivative parameter corresponding to a specified time relative to the onset of the corresponding etching cycle to at least one other pressure-derivative parameter corresponding to the same specified time relative to the onset of the other corresponding etching cycle. The indicator may comprise a time or an over-estimate of a time in which an amount of etching has been or is expected to be achieved. The amount of etching may correspond to etching of approximately all of the sacrificial structure. The outputting step may further comprise determining a cycle in which one of the at least one input parameter or pressure-derivative parameter is below the threshold and in which the corresponding input parameter or pressure-derivative parameter from the preceding trial is above the threshold.

In some embodiments, an optical device formation system is provided. The system may comprise means for providing an etchant to interact with a sacrificial structure of an unreleased MEMS device, which may comprise an etching chamber. The system may comprise means for monitoring a parameter related to pressure changes at least partially attributable to the interaction of the etchant with the sacrificial structure, which may comprise a pressure sensor. The system may comprise means for indicating the extent of etching of the sacrificial structure based on the monitored parameter, which may comprise a computer. The means for indicating the extent of etching of the sacrificial structure based on the monitored parameter may comprise means for indicating a time in which a specific amount of etching of the sacrificial structure has been achieved, which may comprise a computer. The specific amount may be approximately all of the sacrificial structure. The time may comprise an etching cycle. The means for indicating the extent of etching of the sacrificial structure based on the monitored parameter may comprise means for determining an etching cycle for which a change in the monitored parameter with respect to time falls below a specified threshold, and the threshold may be approximately zero. The means for determining an etching cycle may comprise a computer.

EXAMPLE

An unreleased interferometric modulator is positioned within the etch chamber of an etch system as illustrated in FIG. 10. The unreleased interferometric modulator comprises a sacrificial layer of molybdenum. The chamber is initially at approximately 25° C., and no external heat is supplied to the chamber during the process (except for heating induced by the reaction with the etchant and the sacrificial structure that may cause a temperature rise). The chamber pressure is reduced to about 0.1 Torr by applying a vacuum, and xenon difluoride etchant is introduced into the chamber in a plurality of cycles. At the beginning of each cycle, the etchant flows into the chamber for approximately 100 seconds. The etchant is fed to the chamber at a rate of approximately 26 cubic centimeters per minute. Approximately 500 seconds after the etchant is first supplied, gases are removed from the chamber by applying the vacuum, thereby completing the cycle.

The pressure within the chamber is monitored at 10-second intervals beginning at the time the etchant is supplied to the chamber, during both the supplying of etchant to the chamber (t=0 to 100 s in FIG. 11) and after the etchant is supplied (t=101 to 500 s). The etchant is supplied and the gases are removed during eight cycles, and the pressure is monitored across all cycles.

FIG. 11 is a plot showing the pressure within the chamber as a function of time relative to the time the etchant is first supplied for a plurality of etchant cycles. As shown in FIG. 11, the pressure increases as the etchant is introduced to the chamber (t=0 to 100 s). After the etchant is introduced (t>100 s), further flow of etchant into the chamber is terminated, but the pressure continues to increase with time during the early cycles. This increase in pressure may be attributable to the xenon difluoride reacting with the molybdenum to produce xenon gas and molybdenum hexafluoride, which would increase the number of moles of gas and/or the temperature in the chamber. FIG. 11 shows that the pressure increase following the introduction of etchant to the chamber is most pronounced during the middle cycles (e.g., cycles 4 to 6). In the later cycles, the amount of increase in pressure after the etchant is introduced becomes lower, providing an indication that the etching is nearly complete. For example, after the etchant is introduced at the start of the $8^{th}$ cycle, FIG. 11 shows that there is little or no increase in pressure, indicating little or no reaction and thus indicating that the etching is essentially complete.

FIG. 12 shows the pressure across cycles at various time points relative to the cycle onset (e.g., t=100 s, 200 s, 300 s and 400 s after cycle onset). Even though the same amount of etchant is initially supplied to the chamber for all cycles, the pressure is higher during the middle cycles (e.g., cycles 4 to 6) than the early and late cycles. This invention is not bound by theory, but it is believed that, during the initial cycles, a relatively small surface area of the sacrificial structure may be exposed to react with the etchant. During the middle cycles, the etchant may be able to react with a larger surface area of the sacrificial structure. During the later cycles, the sacrificial structure may be nearly removed, thereby reducing the surface area available to react with the etchant. Therefore, the decrease in pressure following the initial increase in pressure in FIG. 12 is an indication that the etching is approaching completion.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method for making a microelectromechanical systems (MEMS) device, comprising:
    (a) providing a chamber and an unreleased MEMS device situated therein, the unreleased MEMS device comprising a sacrificial structure;
    (b) supplying an etchant to the chamber to thereby etch the sacrificial structure;
    (c) monitoring a process parameter related to the pressure within the chamber as a function of time to thereby provide an indication of the extent of etching of the sacrificial structure; and
    (d) removing from the chamber at least a portion of a gaseous product that is formed from the etching of the sacrificial structure with the etchant.

2. The method of claim 1, wherein the monitored process parameter is the change in pressure within the chamber as a function of time.

3. The method of claim 1, wherein the monitored process parameter comprises at least one of the temperature within the chamber and the change in temperature within the chamber as a function of time.

4. The method of claim 1, further comprising discontinuing the supplying of the etchant to the chamber.

5. The method of claim 1 further comprising conducting one or more additional cycles by repeating at least steps (b), (c) and (d).

6. The method of claim 5, wherein the monitored process parameter is a change in a time derivative of a within-cycle pressure across cycles.

7. The method of claim 5, further comprising discontinuing an initiation of an additional cycle upon the providing of the indication.

8. The method of claim 5, wherein the indication is provided when the monitored process parameter corresponding to a specific time relative to the beginning of an additional cycle crosses a pre-selected threshold.

9. The method of claim 5, wherein the indication is provided when the monitored process parameter corresponding to a specific time relative to the beginning of an additional cycle crosses a pre-selected second threshold after having already crossed a pre- selected first threshold.

10. The method of claim 5, further comprising comparing a monitored process parameter measured at a specific time relative to the beginning of the first or additional cycle to a monitored process parameter measured at the same specific time relative to the beginning of a different additional cycle to thereby provide the indication.

11. The method of claim 1, wherein the indication is provided when the monitored process parameter crosses a pre-selected threshold.

12. The method of claim 11, wherein the pre-selected threshold is about zero.

13. The method of claim 11, wherein the pre-selected threshold is about 1%, about 5% or about 10% of a maximum process parameter relative to an initial process parameter.

14. The method of claim 11, wherein the pre-selected threshold is about 105% of a first pressure expected if the etchant does not react with another substance.

15. The method of claim 11, wherein the pre-selected threshold is a pressure change of about 0.2 mT per second or about −0.2 mT per second.

16. The method of claim 1, wherein the unreleased MEMS device comprises:
a substrate;
one or more first layers positioned over the substrate;
a sacrificial layer comprising a sacrificial structure positioned over the one or more first layers; and
one or more second layers positioned over the sacrificial layer.

17. The method of claim 16, wherein the one or more first layers comprise a first electrode.

18. The method of claim 16, wherein the one or more second layers comprise a second electrode.

19. The method of claim 1, wherein a reaction between the etchant and the sacrificial structure produces primarily gaseous products.

20. The method of claim 1, wherein the sacrificial structure comprises molybdenum.

21. The method of claim 1, wherein the etchant comprises xenon difluoride.

22. The method of claim 1, further comprising:
positioning one or more additional unreleased MEMS devices in the chamber, the additional unreleased MEMS devices comprising additional one or more sacrificial structures.

23. The method of claim 1, wherein the unreleased MEMS device comprises an unreleased interferometric modulator.

24. A MEMS device manufactured by the method of claim 1.

25. A method for making a microelectromechanical systems (MEMS) device, comprising:
(a) providing a chamber and an unreleased MEMS device situated therein, the unreleased MEMS device comprising a sacrificial structure;
(b) supplying an etchant to the chamber to thereby etch the sacrificial structure; and
(c) monitoring a process parameter related to the pressure within the chamber as a function of time to thereby provide an indication of the extent of etching of the sacrificial structure, wherein the indication is provided when the monitored process parameter crosses a pre-selected threshold.

26. The method of claim 25, wherein the monitored process parameter is the change in pressure within the chamber as a function of time.

27. The method of claim 25, wherein the monitored process parameter comprises at least one of the temperature within the chamber and the change in temperature within the chamber as a function of time.

28. The method of claim 25, further comprising discontinuing the supplying of the etchant to the chamber.

29. The method of claim 25, further comprising:
(d) removing from the chamber at least a portion of a gaseous product.

30. The method of claim 29, further comprising conducting one or more additional cycles by repeating at least steps (b), (c) and (d).

31. The method of claim 30, wherein the monitored process parameter is a change in a time derivative of a within-cycle pressure across cycles.

32. The method of claim 30, further comprising discontinuing an initiation of an additional cycle upon the providing of the indication.

33. The method of claim 30, wherein the indication is provided when the monitored process parameter corresponding to a specific time relative to the beginning of an additional cycle crosses the pre-selected threshold.

34. The method of claim 30, wherein the indication is provided when the monitored process parameter corresponding to a specific time relative to the beginning of an additional cycle crosses a second pre-selected second threshold after having already crossed the first pre-selected threshold.

35. The method of claim 30, further comprising comparing a monitored process parameter measured at a specific time relative to the beginning of the first or additional cycle to a monitored process parameter measured at the same specific time relative to the beginning of a different additional cycle to thereby provide the indication.

36. The method of claim 25, wherein the pre-selected threshold is about zero.

37. The method of claim 25, wherein the pre-selected threshold is about 1%, about 5% or about 10% of a maximum process parameter relative to an initial process parameter.

38. The method of claim 25, wherein the pre-selected threshold is about 105% of a first pressure expected if the etchant does not react with another substance.

39. The method of claim 25, wherein the pre-selected threshold is a pressure change of about 0.2 mT per second or about −0.2 mT per second.

40. The method of claim 25, wherein the unreleased MEMS device comprises:
a substrate;
one or more first layers positioned over the substrate;
a sacrificial layer comprising a sacrificial structure positioned over the one or more first layers; and one or more second layers positioned over the sacrificial layer.

41. The method of claim 40, wherein the one or more first layers comprise a first electrode.

42. The method of claim 40, wherein the one or more second layers comprise a second electrode.

43. The method of claim 25, wherein a reaction between the etchant and the sacrificial structure produces primarily gaseous products.

44. The method of claim 25, wherein the sacrificial structure comprises molybdenum.

45. The method of claim 25, wherein the etchant comprises xenon difluoride.

46. The method of claim 25, further comprising:
   positioning one or more additional unreleased MEMS devices in the chamber, the additional unreleased MEMS devices comprising additional one or more sacrificial structures.

47. The method of claim 25, wherein the unreleased MEMS device comprises an unreleased interferometric modulator.

48. A MEMS device manufactured by the method of claim 25.

49. A method for making a microelectromechanical systems (MEMS) device, comprising:
   (a) providing a chamber and an unreleased MEMS device situated therein, the unreleased MEMS device comprising a sacrificial structure;
   (b) supplying an etchant to the chamber to thereby etch the sacrificial structure; and
   (c) monitoring a process parameter related to the pressure within the chamber as a function of time to thereby provide an indication of the extent of etching of the sacrificial structure;
   wherein the unreleased MEMS device comprises:
      a substrate;
      one or more first layers positioned over the substrate;
      a sacrificial layer comprising a sacrificial structure positioned over the one or more first layers; and
      one or more second layers positioned over the sacrificial layer.

50. The method of claim 49, wherein the monitored process parameter is the change in pressure within the chamber as a function of time.

51. The method of claim 49, wherein the monitored process parameter comprises at least one of the temperature within the chamber and the change in temperature within the chamber as a function of time.

52. The method of claim 49, further comprising discontinuing the supplying of the etchant to the chamber.

53. The method of claim 49, further comprising:
   (d) removing from the chamber at least a portion of a gaseous product.

54. The method of claim 53, further comprising conducting one or more additional cycles by repeating at least steps (b), (c) and (d).

55. The method of claim 54, wherein the monitored process parameter is a change in a time derivative of a within-cycle pressure across cycles.

56. The method of claim 54, further comprising discontinuing an initiation of an additional cycle upon the providing of the indication.

57. The method of claim 54, wherein the indication is provided when the monitored process parameter corresponding to a specific time relative to the beginning of an additional cycle crosses a pre-selected threshold.

58. The method of claim 54, wherein the indication is provided when the monitored process parameter corresponding to a specific time relative to the beginning of an additional cycle crosses a pre-selected second threshold after having already crossed a pre-selected first threshold.

59. The method of claim 54, further comprising comparing a monitored process parameter measured at a specific time relative to the beginning of the first or additional cycle to a monitored process parameter measured at the same specific time relative to the beginning of a different additional cycle to thereby provide the indication.

60. The method of claim 49, wherein the indication is provided when the monitored process parameter crosses a pre-selected threshold, wherein the pre-selected threshold is about zero.

61. The method of claim 49, wherein the indication is provided when the monitored process parameter crosses a pre-selected threshold, wherein the pre-selected threshold is about 1%, about 5% or about 10% of a maximum process parameter relative to an initial process parameter.

62. The method of claim 49, wherein the indication is provided when the monitored process parameter crosses a pre-selected threshold, wherein the pre-selected threshold is about 105% of a first pressure expected if the etchant does not react with another substance.

63. The method of claim 49, wherein the indication is provided when the monitored process parameter crosses a pre-selected threshold, wherein the pre-selected threshold is a pressure change of about 0.2 mT per second or about −0.2 mT per second.

64. The method of claim 49, wherein the one or more first layers comprise a first electrode.

65. The method of claim 49, wherein the one or more second layers comprise a second electrode.

66. The method of claim 49, wherein a reaction between the etchant and the sacrificial structure produces primarily gaseous products.

67. The method of claim 49, wherein the sacrificial structure comprises molybdenum.

68. The method of claim 49, wherein the etchant comprises xenon diflouride.

69. The method of claim 49, further comprising:
   positioning one or more additional unreleased MEMS devices in the chamber, the additional unreleased MEMS devices comprising additional one or more sacrificial structures.

70. The method of claim 49, wherein the unreleased MEMS device comprises an unreleased interferometric modulator.

71. A MEMS device manufactured by the method of claim 49.

* * * * *

UNITED STATES PATENT AND TRADEMARK OFFICE
CERTIFICATE OF CORRECTION

PATENT NO. : 7,569,488 B2
APPLICATION NO. : 11/767430
DATED : August 4, 2009
INVENTOR(S) : Marjorio Rafanan It is certified that error appears in the above-identified patent and that said Letters Patent is hereby corrected as shown below:

Title Page, item [57] Abstract, line 3, please delete "MEMS" and insert therefore, --(MEMS)--.

At column 23, line 1, please delete "1" in Claim 5 and insert therefore, --1,--.

At column 23, line 18, please delete "pre- selected" in Claim 9 and insert therefore, --pre-selected--.

At column 26, line 48, please delete "diflouride" in Claim 68 and insert therefore, --difluoride--.

Signed and Sealed this

Twenty-third Day of February, 2010

David J. Kappos
*Director of the United States Patent and Trademark Office*